United States Patent
Gorlow et al.

(10) Patent No.: US 9,936,295 B2
(45) Date of Patent: Apr. 3, 2018

(54) ELECTRONIC DEVICE, METHOD AND COMPUTER PROGRAM

(71) Applicant: Sony Corporation, Tokyo (JP)

(72) Inventors: Stanislaw Gorlow, Paris (FR);
Mathieu Ramona, Paris (FR);
Francois Pachet, Paris (FR)

(73) Assignee: Sony CORPORATION, Tokyo (JP)

(*) Notice: Subject to any disclaimer, the term of this patent is extended or adjusted under 35 U.S.C. 154(b) by 0 days.

(21) Appl. No.: 15/206,421

(22) Filed: Jul. 11, 2016

(65) Prior Publication Data

US 2017/0026748 A1 Jan. 26, 2017

(30) Foreign Application Priority Data

Jul. 23, 2015 (EP) .................................... 15177992

(51) Int. Cl.
*A63H 5/00* (2006.01)
*H04R 3/04* (2006.01)
*H03H 21/00* (2006.01)

(52) U.S. Cl.
CPC ........... *H04R 3/04* (2013.01); *H03H 21/0029* (2013.01); *G10H 2210/056* (2013.01); *G10H 2250/055* (2013.01); *H04R 2430/03* (2013.01)

(58) Field of Classification Search
CPC ................. H04R 3/04; H03H 21/0029; G10H 2210/056; G10H 2250/055
USPC ......................................................... 84/609
See application file for complete search history.

(56) References Cited

U.S. PATENT DOCUMENTS

| | | | |
|---|---|---|---|
| 7,158,643 B2* | 1/2007 | Lavoie | H04S 7/301 381/303 |
| 7,454,333 B2 | 11/2008 | Ramakrishnan et al. | |
| 8,275,148 B2 | 9/2012 | Li et al. | |
| 8,367,923 B2 | 2/2013 | Humphrey | |
| 2010/0014693 A1* | 1/2010 | Park | G06Q 30/0601 381/119 |
| 2010/0174389 A1 | 7/2010 | Blouet et al. | |
| 2012/0084084 A1* | 4/2012 | Zhu | G10L 21/0208 704/233 |

OTHER PUBLICATIONS

Bernard Widrow, et al, Adaptive Noise Cancelling: Principles and Applications, Proceeding of the IEEE Dec. 1975, 26 pages.
Bernard Widrow et al, "Adaptive Signal Processing", 1985, 11 pages.
Saeed V. Vaseghi, "Advanced Digital Signal Processing and Noise Reduction", Fourth Edition, 2008, 532 pages.
Bernard Widrow et al, "On the statistical efficiency of the LMS algorithm with nonstationary inputs", IEEE Transactions on Information Theory, vol. $_{IT}$-30, No. 2, Mar. 1984, 11 pages.

(Continued)

*Primary Examiner* — Jianchun Qin
(74) *Attorney, Agent, or Firm* — Oblon, McClelland, Maier & Neustadt, L.L.P.

(57) ABSTRACT

An electronic device comprising a processing unit arranged to determine an estimation signal (y(k)) based on an input signal (x(k)) and based on a non-stationary reference signal ($s_0$(k)).

12 Claims, 16 Drawing Sheets

(56) References Cited

OTHER PUBLICATIONS

Stanislaw Gorlow et. al., "Informed Audio Source Separation Using Linearly Constrained Spatial Filters", IEEE Transactions on Audio, Speech and Language Processing, Institute of Electrical and Electronics Engineers, 2013, vol. 20, No. 9, 13 pages, HAL Id: hal-00725428.

Brian Glasberg, et al., "Derivation of Auditory Filter Shapes from Notched-noise data", Article in Hearing Research 47, Sep. 1990, pp. 103-138 (abstract thereof).

Alan V. Oppenheim, Discrete-Time Signal Processing, 2nd ed., 1998, 896 pages.

P. Kabal, et al., "An examination and interpretation of ITU-R BS 1387; Perceptual evaluation of audio quality", Telecommunications & signal processing laboratory, Version 2, 2003, 96 pages.

"PQevalAudio", version 1.0, McGill University, Telecommunications & Signal Processing Laboratory, Multimedia Signal Processing, Sep. 2010, Audio file, accessible under http://wwwmmsp.ece.mcgill.ca/Documents/Downloads/PQevalAudio/.

Stanislaw Gorlow et. al., "Informed Separations of Spatial Images of Stereo Music Recordings Using Second-Order Statistics", HAL, Hal Id: hal-00865352, Sep. 2013, 7 pages.

Non-Patent Reference 1 : How to Remove vocals from songs using Audacity, 2015, 5 pages http://audacity.wonderhowto.com/how-to/remove-vocals-from-songs-usin.

\* cited by examiner

ELECTRONIC DEVICE, METHOD AND COMPUTER PROGRAM

TECHNICAL FIELD

The present disclosure generally pertains to the field of Digital Signal Processing (DSP), in particular to electronic devices, methods and computer programs for determining an estimation signal (e.g. an estimated contribution of a solo instrument) based on an input signal (e.g. a music mix comprising a solo and an accompaniment captured with a microphone) and a non-stationary reference signal (e.g. an accompaniment).

TECHNICAL BACKGROUND

Practicing a musical instrument is usually associated with professional supervision and personalized feedback when it comes to an unskilled apprentice. This is particularly true for a novice. Otherwise, fatigue may set in quickly, and even the most talented student can lose interest in continuing with practice or even in learning music as such. But yet, not everybody is willing to pay a personal tutor, especially if the outcome is unclear. Other factors, such as dispensability, can also influence one's decision. A reasonable compromise may consist in learning agents that take the role of the tutor. And to avoid further spendings on expensive hardware, the agents would preferably be installed on a tablet computer, which as of today is equipped with a speaker and a microphone.

Practicing, e.g., the jazz guitar, one of the main obstacles one would surely encounter from a signal processing point of view is the isolation of the solo from the recording, which as a rule contains the solo and the accompaniment. The latter is generated by the computer and can be deemed known. Thus, the challenging nature of the task stems from the fact that the accompaniment signal is altered by the speaker, the acoustic channel, and the microphone. Furthermore, the high spectral dynamics of musical signals and their high bandwidth render the task problematic for classic solutions.

SUMMARY

According to a first aspect the disclosure provides an electronic device comprising a processor arranged to determine an estimation signal based on an input signal and a non-stationary reference signal.

According to a further aspect the disclosure provides a method comprising determining an estimation signal based on an input signal and based on a non-stationary reference signal.

According to a yet further aspect the disclosure provides a computer program comprising instructions, the instructions when executed on a processor causing the processor to determine an estimation signal based on an input signal and based on a non-stationary reference signal.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

1. General Explanations

Figure 1:
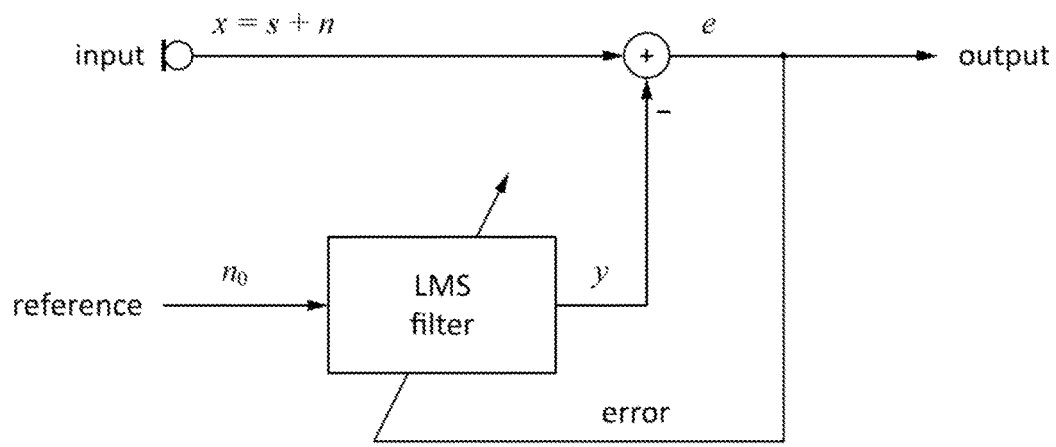
FIG. 1 depicts, as background art, the operation of an adaptive noise canceller in the form of a block diagram.

Before a detailed description of the embodiments under reference to the figures is given, some general explanations concerning the detailed embodiments are made.

An electronic device according to the embodiments may comprise a processor arranged to determine an estimation signal based on an input signal and a non-stationary reference signal.

The electronic device may be a personal computer, a tablet computer, a smartphone, a game station or the like. A processor may be any kind of processing device, for example a central processing unit or other hardware within a computer that executes a program code.

The input signal may be any kind of audio signal, for example an electronic signal produced by a microphone when capturing sound from the environment. In some embodiments, the input signal is a composite audio signal comprising a mix of a solo audio signal (comprising e.g. sound of a solo guitar) and an accompaniment audio signal (comprising e.g. sound of a band consisting of background guitars, keyboards, drums, etc.). The solo audio signal may for example stem from a user who plays or practices a music instrument live. The accompaniment audio signal may be a piece of music which was prerecorded and which is played back by the user by means of an audio player and a loudspeaker so that the user can play its solo over the prerecorded accompaniment.

The input signal may thus be a composite signal that is composed of a modified version of the non-stationary reference signal, e.g. a recorded accompaniment, and a signal of interest, e.g. a recorded solo.

A non-stationary reference signal may be any kind of signal which exhibits high spectral dynamics, characterized by a large bandwidth and a complex spectral envelope that may vary significantly over short time periods. This is to distinguish a non-stationary reference signal from noise, which typically has a flat spectrum with little temporal variation. For example, music signals that embody one or more musical instruments typically possess non-stationary spectral dynamics.

According to the embodiments, the non-stationary reference signal represents a clean version of the signal of interest in the input signal that is to be removed or suppressed.

The non-stationary reference signal may for example be a predefined accompaniment signal. It may for example be a pregenerated or prerecorded signal. The non-stationary reference signal may for example represent the prerecorded music produced by a band or ensemble which plays a piece of music. In some of the embodiments the non-stationary reference signal may be described as "N minus 1", that is all voices of a piece of music without the solo. The non-stationary reference signal may for example represent the sound of a band consisting of guitars, a keyboard and drums without the soloist (e.g. lead guitar).

The estimation signal may be any kind of digital signal that is obtained by a processing device based on the input signal and a non-stationary reference signal by applying some digital signal processing algorithm. In the embodiments, the estimation signal may represent an estimate of the accompaniment contribution in the input signal. As such, the estimation signal may be removed from the input signal to obtain an audio signal which estimates the solo contribution in the input signal. The estimation signal may thus help to separate the solo contribution in the input signal from the accompaniment contribution in the input signal.

The processor may further be arranged to render the non-stationary reference signal based on an audio file and/or an automatic accompaniment generation engine. The non-stationary reference signal may for example be an audio signal generated by rendering a music file (e.g. in the WAV or MP3 format) stored on a recording medium such as a compact disc or a hard disk drive. Alternatively, the non-stationary reference signal may also be a synthetic accompaniment signal rendered by a music creation software from MIDI.

The processor may be arranged to determine the estimation signal by any algorithm that allows to conclude on a contribution in the input signal that is strongly correlated with the non-stationary reference signal. For example, the processor may use any filter to compute a statistical estimate of an unknown signal using a related signal as an input and filtering that known signal to produce an estimate of the undesired signal in the input signal as an output.

The processor may for example be arranged to determine the estimation signal by applying moving-average Wiener filtering. A Wiener filter minimizes the mean square error between the reference signal and the input signal.

A moving-average Wiener filter may be computed on blocks of sampled data.

The filter typically has a finite impulse response.

The processor may further be arranged to determine an auto-covariance matrix for the non-stationary reference signal, and to determine a cross-covariance matrix for the input signal and the non-stationary reference signal.

The processor may further be arranged to determine optimal filter weights based on the auto-covariance matrix and the cross-covariance matrix. The optimal weights may for example be given by the Wiener-Hopf solution.

The processor may further be arranged to determine the estimation signal by applying Wiener filtering in different subbands. Subband Wiener filtering may be obtained by computing the Wiener filter in the frequency domain and by dividing the frequency axis into a number of subbands.

The processor may further be arranged to transform the non-stationary reference signal and the input signal into the Fourier domain in order to obtain a frequency-domain reference signal, and, respectively, a frequency-domain input signal.

The processor may for example be arranged to form subbands on an equivalent-rectangular-bandwidth-rate (ERB) scale. According to the embodiments, the equivalent rectangular bandwidth or ERB is a measure used in psychoacoustics, which gives an approximation to the bandwidths of the auditory filters of human hearing using a simplified model of the filters in the form of rectangular band-pass filters.

The processor may further be arranged to determine centroids of the frequency-domain reference signal, and respectively the frequency-domain input signal, in the subbands. A centroid may for example be obtained by averaging a signal within a respective subband. A centroid may for example be obtained by computing the arithmetic mean over all samples in a subband.

The processor may further be arranged to determine a frequency-domain estimation signal based on the centroids.

The processor may further be arranged to determine the estimation signal based on a single-input-double-output signal model. A single-input-double-output signal model may model the signals of two microphones which capture the same audio signal and which are placed in a close proximity of each other.

A single-input-double-output signal model may employ maximal-ratio combining (MRC) as a method of receiver diversity combining.

The processor may further be arranged to determine an estimation error signal based on the observed signal and the estimation signal. The estimation error signal may for example be obtained by subtracting the estimation signal from the input signal. In the embodiments, the estimation error signal corresponds to an estimate of the solo contribution in the input signal.

The processor may further be arranged to determine the estimation error signal by subtracting the estimation signal and the observed signal in the spectral domain. The spectra used for subtracting the estimation signal and the observed signal in the spectral domain may for example be computed using the (short-time) Fourier transform.

The processor may further be arranged to output the estimation error signal as an estimated audio solo signal. In some embodiments, the electronic device generates an audio file from the estimation error signal. The audio file may be stored on a hard disk in the electronic device or it may be transferred to the external of the electronic device via an I/O interface. The user may play back this audio file with an audio player in order to receive feedback of the solo playing which may be helpful in practicing the solo instrument or which may be helpful in preparing for a concert or the like.

The electronic device may further comprise a microphone for capturing the input signal. The input signal may for example be captured by the built-in microphone of a tablet computer or smartphone. Alternatively, the input signal may be captured by a microphone which is external to the electronic device, for example with a microphone which is attached to a personal computer.

The electronic device may further comprise two or more microphones, either integrated into the electronic device or attached to the electronic device.

Even though a single-input-double-output signal model is described here with reference to two microphones, more than two microphones may be used as well. For example arbitrary arrays of microphones may be employed. The microphones of a microphone array may be microphones of the same type which are arranged in close proximity to each other.

A method according to the embodiments may comprise determining an estimation signal based on an input signal and based on a non-stationary reference signal. Exemplifying aspects of determining an estimation signal based on an input signal and based on a non-stationary reference signal have been described above with reference to an electronic device executing such methods.

A computer program according to the embodiments may comprise instructions, the instructions when executed on a processor causing the processor to determine an estimation signal based on an input signal and based on a non-stationary reference signal. Exemplifying aspects of such a computer program determining an estimation signal based on an input signal and based on a non-stationary reference signal have been described above with reference to an electronic device executing such a computer program.

II. Adaptive Noise Cancellation

Adaptive noise cancellation, or cancelling, is a known signal processing technique widely used to suppress additive noise in a corrupted signal. It requires a reference noise input that is strongly correlated with the corrupting noise signal to work properly. In this section, we revisit the main principles of adaptive noise cancellation.

A. Signal Model

FIG. 1 depicts the operation of an adaptive noise canceller in the form of a block diagram. The reference noise no is fed to the adaptive least mean squares (LMS) filter, which produces the estimate y and subtracts it from the noisy input s+n. As it was mentioned before, $n_0$ and n are correlated, whereas s and n are uncorrelated. All variables are Gaussian with zero mean. From the filter's point of view, the noisy input x is the desired response while the output acts as the error that drives the adaptation. By minimizing the error e in the least-squares sense, the adaptive filter provides the best fit of $n_0$ for n in x. At the same time, the error, or output, e converges to the best least-squares estimate for the signal s.

B. Adaptive LMS Filtering

The LMS filter is given by the following recurrence relation:

$$w(k+1) = w(k) + \mu n_0(k) e(k) \quad (1)$$
$$e(k) = x(k) - \underbrace{w^T(k) n_0(k)}_{y(k)},$$

where $w(k) \in \mathbb{R}^M$ is the weight vector at time instant k, and $w(k+1)$ is the anticipated weight vector, respectively, $e(k)$ is the adaptation error, i.e., the difference between the observed signal $x(k)$ and the noise estimate $y(k)$, $n_0(k) \in \mathbb{R}^M$ is thus the input noise sequence, and $\mu$ is a design parameter, which determines stability, rate of convergence, etc. The scale-invariant version of the LMS filter, which is insensitive to the scaling of the input, $n_0(k)$, is obtained by replacing $$n_0(k) \leftarrow \frac{n_0(k)}{\|n_0(k)\|_2^2} \quad (2)$$

in the upper equation of (1). Hence, this variant is also called the normalized LMS (NLMS) filter. The LMS filter produces an output signal that is the best least-squares estimate of n(k) in x(k). It uses gradient descent to adjust the filter weights.

C. Pre-Whitening

The adaptive LMS filter operates best in presence of white noise. Any correlation between the elements in $n_0(k)$ results in a slower convergence rate due to the associated correlation between the filter coefficients. The convergence rate for non-white, i.e., colored noise improves substantially if the data in $n_0(k)$ is decorrelated. Thus, on the assumption that $n_0(k)$ is an autoregressive process of order P, we may resort to linear prediction to find a corresponding inverse filter, which can be then used to flatten the noise spectrum. This is accomplished as follows. The pre-whitened reference noise signal is $$\tilde{n}_0(k) = n_0(k) - \hat{n}_0(k) = v^T n_0(k), \quad (3)$$

where $\hat{n}_0(k)$ is a weighted sum of the past values of $n_0(k)$, $$\hat{n}_0(k) = \sum_{p=1}^{P} \alpha_p n_0(k-p), \quad (4)$$

and $a_p$, p=1, 2, ..., P are the predictor's coefficients. The inverse filter, accordingly, has the following form $$v = [1 - a_1 - a_2 \ldots - a_P]^T \quad (5)$$

For the sake of consistency, we proceed in the same way with the noise residual in the error signal using the same weights:

$$\tilde{e}(k) = e(k) - \sum_{p=1}^{P} \alpha_p e(k-p) = v^T e(k). \quad (6)$$

Finally, the update rule for the LMS filter in (1) becomes $$w(k+1) = w(k) + \mu \tilde{n}_0(k) \tilde{e}(k). \quad (7)$$

It should be noted that the error signal $e(k)$ in (1) is left as it, i.e. untouched.

What we achieve by decorrelating the elements in $n_0(k)$ is a more circular mean-square-error (MSE) function, which, as an immediate consequence, speeds up the convergence. It is equivalent to normalizing and rotating the hyperboloid in a way that its principal axes align with the (orthogonal) axes of the parameter space $\mathbb{R}^M$ of $w(k)$. Orthogonalization, or pre-whitening, also helps with non-stationary noise. In that case, however, the inverse filter should be tracked over time. Further details on pre-whitening and the LMS filter's efficiency with non-stationary inputs are known to the skilled person.

D. Moving-Average Wiener Filtering

The corresponding optimal filter is calculated as shown. It represents the solution to which the adaptive filter converges after a sufficiently large number of iterations under stationary conditions. Since the data sequence may be of infinite length, we calculate a different filter for each new block of data.

Let M successive samples of a reference noise, $n_0(k)$, be stored as a vector.

$$n_0(k) = [n_0(k) n_0(k-1) \ldots n_0(k-M+1)]^T \quad (8)$$

with $n_0(k) \in \mathbb{R}^M$. Convolving $n_0(k)$ with $$w(k) = [w_0(k) w_1(k) \ldots w_{M-1}(k)]^T, \quad (9)$$

where $w(k) \in \mathbb{R}^M$ is a transversal finite impulse response or FIR filter of order M−1, we obtain $$y(k) = w^T(k)n_0(k). \quad (10)$$

Now, extending this principle to a block of size N, we have $$y(k) = [y(k)y(k+1) \ldots y(k+N-1)] \quad (11)$$

with $y(k) \in \mathbb{R}^{1 \times N}$, which is obtained according to $$y(k) = w^T(k)N_0(k), \quad (12)$$

where $N_0(k) \in \mathbb{R}^{M \times N}$, M<N, is a Toeplitz matrix, i.e.

$$N_0(k) = [n_0(k)n_0(k+1) \ldots n_0(k+N-1)]. \quad (13)$$

The estimation error, or the output, is the difference $$e(k) = x(k) - y(k), \quad (14)$$

and respectively $$e(k) = [e(k)e(k+1) \ldots e(k+N-1)] \quad (15)$$

with $e(k) \in \mathbb{R}^{1 \times N}$. Equally, $$x(k) = [x(k)x(k+1) \ldots x(k+N-1)] \quad (16)$$

with $x(k) \in \mathbb{R}^{1 \times N}$. Given (10) and (14), we see that the signal $\hat{s}(k)$ in an arbitrary data block is given by the sequence $$e(k) = x(k) - w^T(k)N_0(k) \equiv \hat{s}(k). \quad (17)$$

The LMS filter coefficients are adapted via minimization of $e^2(k)$, which corresponds to the minimization of the mean error power when s(k), n(k), and $n_0(k)$ are stationary. This on the other hand is equivalent to minimizing the mean noise power by matching the correlated noise $n_0(k)$ to n(k) which is accomplished through w(k). The optimal weights are thus given by the Wiener-Hopf solution $$w_o(k) = R_{n_0 n_0}^{-1}(k) p_{n_0 x}(k), \quad (18)$$

where $R_{n_0 n_0}(k)$ is an auto-covariance matrix and $p_{n_0 x}(k)$ is a cross-covariance vector between $n_0(k)$ and x(k).

In order to compute (18), one would typically replace the variables $R_{n_0 n_0}(k)$ and $p_{n_0 x}(k)$ by their sample estimates $$\hat{R}_{N_0 N_0}(k) = \frac{1}{N} N_0(k) N_0^T(k) \quad (19)$$

and $$\hat{p}_{N_0 x}(k) = \frac{1}{N} N_0(k) x^T(k). \quad (20)$$

This means that the filter $w_o(k)$ is computed over a window of the size M+N−1. As the signal model presumes weak stationarity and ergodicity for n(k), the hop size L for k can be set equal to N to minimize computational cost. If n(k) is non-stationary, however, the hop size, and so the size of x(k) and y(k), should be reduced to a number that corresponds to the size of a segment over which n(k) is stationary. In audio, L can also be chosen according to the temporal resolution of the human ear. Note that it may appear that it is necessary to compute the filter itself using M+N−1 samples, whereas the estimated sequence, $\hat{s}(k)$, might be L samples long. That would be the case, e.g., if M>>L, and thus N>>L to make sure that N>M for computational reasons. In the extremist case, L=1, i.e. the filtering is carried out sample-wise.

From the considerations above, it should become evident that this technique is very expensive for non-stationary noise and for a high-order filter. And even though algorithms exist that do efficiently solve (18) via the Cholesky decomposition e.g., they still possess a considerable computational load and also require a great amount of memory. As a general rule, the order of the filter scales with the spectral dynamics of n(k).

E. Spectral Subtraction

One of the issues related to the above technique is that when s(k), and n(k), are (locally) correlated, y(k) will be estimated with a higher amplitude than the actual noise. This may lead to audible artifacts after subtracting y(k) from x(k). Another issue are abrupt changes, or jumps, of filter weights between consecutive blocks, which may cause clicks and pops. Linear interpolation is one possible approach to handle this. A more effective way to tackle both issues simultaneously is to carry out the subtraction in the spectral domain according to $$|E(\omega)| = \begin{cases} \sqrt[p]{|X(\omega)|^p - |Y(\omega)|^p} & \text{if } |X(\omega)| > |Y(\omega)|, \\ 0 & \text{otherwise.} \end{cases} \quad (21)$$

$$\arg E(\omega) = \arg X(\omega),$$

where t is the frequency, $|\cdot(\omega)|$ refers to the magnitude, and $\arg \cdot(\omega)$ refers to the argument or phase at $\omega$. The spectra are computed using the short-time Fourier transform, e.g., and p is typically set to 2. The time-domain signal e(k) is obtained by applying the inverse of the transform to (21).

III. Accompaniment Cancellation

In this section, based on the previous considerations we draw a parallel between adaptive noise cancellation and the related accompaniment cancellation problem. Although it appears to be technically similar to the echo cancellation problem, there is a difference. Put simply, echo is a natural phenomenon and echo cancellation is a two-way communication problem. Our case is a one-way communication problem, which serves the purpose of simultaneous self-assessment during practice and also enables a machine analysis of the solo performance.

A. Extended Signal Model

The previous signal model is adapted and further extended in order to comply with the use case. The recorded signal is $$x(k) = h(k) * [d(k) + s(k)], \quad (22)$$

where d(k) is the desired solo, s(k) the accompaniment, and h(k) the impulse response of the microphone. The asterisk * denotes convolution. More precisely, we consider s(k) to be approximately equal to $$s(k) \approx Ag(k) * s_0(k-\kappa), \quad (23)$$

i.e. the result of the colorization of the reference $s_0(k)$ by the speaker g(k), which is attenuated and delayed by $\kappa$ samples on its path to the microphone through the acoustic channel. Modifications of the solo that are induced by the channel are ignored or are considered as being part of the signal.

Any kind of additive white noise is omitted due to short distances between the sound sources and the microphone. We measure a signal-to-noise ratio (SNR) near 50 dB for the solo, e.g. As before, we postulate statistical independence for the solo and the accompaniment. In addition, the propagation between the speaker and the microphone first and foremost takes place in and over the direct path, see (23) and FIG. 2.

Figure 2:
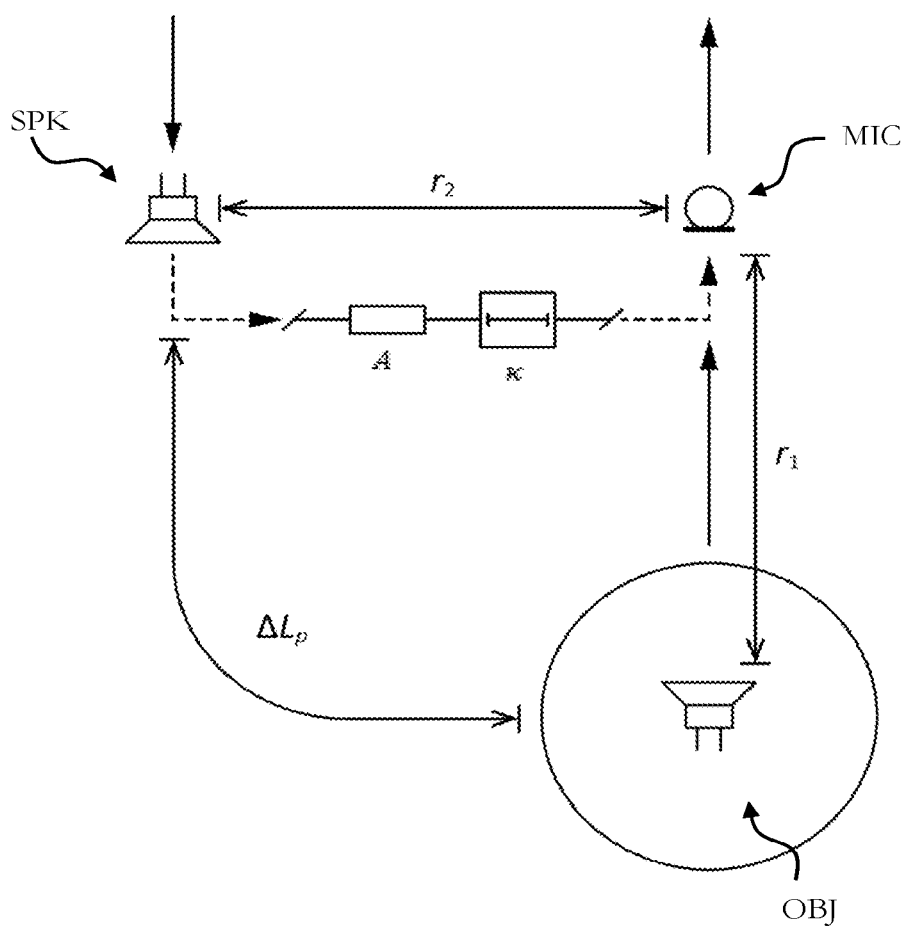
FIG. 2 schematically describes the accompaniment cancellation problem.

FIG. 2 illustrates the accompaniment cancellation problem. A loudspeaker SPK is arranged to play back an audio signal, which represents the accompaniment. A soloist OBJ (illustrated here as a guitar amplifier) is arranged to produce the sound of the solo instrument. A microphone MIC is arranged to capture the sound played by the soloist OBJ and the accompaniment reproduced by speaker SPK. The solo signal is transferred via path $r_1$ from the soloist OBJ to microphone MIC. The accompaniment signal is transferred via path $r_2$ from the speaker SPK to microphone MIC. The transmission path $r_2$ implies an attenuation A and a delay κ of the accompaniment signal captured at microphone MIC with respect to the reference signal reproduced at speaker SPK. $\Delta L_p$ denotes the difference between the sound pressure levels (SPL) of the speaker SPK and the guitar amp OBJ (see equation (46)).

B. Convergence Analysis

Applying the optimum solution from (18) to (22), we have $$w_0(k) = R_{s_0 s_0}^{-1}(k) p_{s_0 x}(k). \tag{24}$$

Now, the sample cross-covariance vector writes $$\hat{p}_{s_0 x}(k) = \frac{1}{N} S_0(k) x^T(k) \tag{25}$$

$$= \frac{1}{N} S_0(k)[D^T(k) + S^T(k)] h,$$

and so $$p_{s_0 x}(k) = [R_{s_0 d}(k) + R_{s_0 s}(k)] h, \tag{26}$$

where $$h = [h_0 \ h_1 \ \ldots \ h_{M-1}] \in \mathbb{R}^M \tag{27}$$

is the microphone's finite impulse response of order M−1. The two Toeplitz matrices D(k) and S(k) are constructed in line with $$A(k) = \begin{bmatrix} a(k) & a(k-1) & \ldots & a(k-M+1) & \ldots & a(k-N+1) \\ \vdots & a(k) & \ldots & a(k-M+2) & \ldots & a(k-N+2) \\ \vdots & \vdots & \ddots & \vdots & \vdots & \vdots \\ 0 & \vdots & \ddots & \vdots & \vdots & \vdots \\ 0 & 0 & \ldots & a(k) & \ldots & a(k-N+M) \end{bmatrix} \in \mathbb{R}^{M \times N}, \tag{28}$$

$M < N$ (the structure of a Toeplitz matrix used to formulate convolution as a matrix multiplication).

Using (26), (24) becomes $$w_o(k) = R_{s_0 s_0}^{-1}(k)[R_{s_0 d}(k) + R_{s_0 s}(k)] h. \tag{29}$$

From (29) it can be seen that if $E\{s_0(k)d(k)\}=0$ ∀k and if $E\{s_0(k)s(k)\}=E\{s_0(k)s_0(k)\}$∀k, i.e. if the channel has no influence on the accompaniment, the optimum filter $w_0$ is equal (converges) to the microphone's impulse response h. It also means that the filter should be as long as h. However, in practice, the filter should be computed using a finite sample, as indicated by the time index k and the sample size N. And so, depending on the sample covariance between d(k), s(k), and $s_0(k)$, the filter may locally vary. Thus, in some embodiments the hop size between two samples is kept sufficiently small to avoid artifacts at transition points. It should also be taken into consideration that the sample size N should be about ten times longer than the filter length for it to converge towards the optimum. This, inevitably, comes along with a high computational load. The solo estimate is equal to the estimation error, i.e.

$$e(k) = x(k) - w_o^T(k) s_0(k) \tag{30}$$

$$\stackrel{(29)}{=} h^T[d(k) + s(k)] - h^T[R_{s_0 d}(k) + R_{s_0 s}(k)] R_{s_0 s_0}^{-1}(k) s_0(k) \tag{31}$$

$$= h^T \underbrace{[d(k) - R_{s_0 d}(k) R_{s_0 s_0}^{-1}(k) s_0(k)]}_{=d(k) \text{ iff } E[s_0(k)d(k)]=0} +$$

$$h^T \underbrace{[s(k) - R_{s_0 s}(k) R_{s_0 s_0}^{-1}(k) s_0(k)]}_{=0 \text{ iff } E[s_0(k)s(k)]=E[s_0(k)s_0(k)]}.$$

Eq. (31) can be interpreted as follows. If the guitar player is mute, i.e. d(k)=0, and there is no difference between $s_0(k)$ and s(k), i.e. the speaker and the room are negligible, e(k) is zero and so is the estimate d(k). If the speaker and the room are not negligible, the error depends on how strongly s(k) is correlated with $s_0(k)$. The stronger, the smaller the error. If, however, the player is performing, the error is further subject to the correlation between the solo d(k) and $s_0(k)$. Since the cross-correlation between independent sources is never zero for finite samples, we can expect the solo estimate d̂(k) to be additionally degraded to the extent of the correlation between the solo and the reference accompaniment. Either way, it can be seen that the signature of the microphone (colorization) is part of the estimate, i.e. it is not equalized.

C. Delay Compensation

Delay compensation may help improve the result of the cancellation, since it will maximize the sample cross-covariance between s(k) and $s_0(k)$. Delay compensation can be done manually or also automatically in a preceding calibration procedure. One option is to play back and record the accompaniment without the solo and to check where the cross-correlation function attains its maximum. In the case at hand, where a tablet computer is utilized for both the playback and the recording, the microphone's distance is about 25 cm from the speaker. Given that the speed of sound in dry air at 20° C. is around 343 m/s, the time delay amounts to 0.72 ms or 32 samples at a sampling rate of 44.1 kHz. But as the delay in this case is much smaller than the sample size, which counts several thousands of observations, it also can be ignored. A much greater time offset between x(k) and $s_0(k)$ is due to the hardware. The exact latency of the speaker and the microphone usually can be found in the system preferences and can be taken into account when determining the delay.

D. Short-Time Subband Wiener Filtering

As an alternative to the standard technique from Section II-D, we present a different technique for computing (24). It may be much faster and may require much less memory. More importantly, the technique is real-time capable.

We resort to the short-time Fourier transform (STFT) and compute the local spectra $S_0(\omega)$ and $X(\omega)$. Then we form Z subbands on the equivalent rectangular bandwidth rate scale, which is given by $$ERBS(f) = 21.4 \cdot \log_{10}(1 + 4.37 \cdot f), \tag{32}$$

where f is the frequency in kHz. In the continuous case, ω is equivalent to f. The spectral components in the ζth subband can be represented by the corresponding centroids $S_0(\zeta)$ and $X(\zeta)$, ζ=1, 2, . . . , Z. This would be equivalent to making a sequence of N samples pass through a non-uniform complex filter bank consisting of Z auditory filters. STFT provides the availability of many optimized libraries to compute the underlying fast Fourier transform (FFT).

The computation of the filter from (24) is as follows. The auto-covariance of $S_0(\omega)$ in subband ζ is $$R_{S_0 S_0}(\zeta) = \frac{1}{|\Omega_\zeta|} \sum_{\inf \Omega_\zeta}^{\sup \Omega_\zeta} |S_0(\omega)|^2 \quad \forall \, \omega \in \Omega_\zeta \qquad (33)$$

and the cross-covariance between $S_0(\omega)$ and $X(\omega)$ is $$P_{S_0 X}(\zeta) = \frac{1}{|\Omega_\zeta|} \sum_{\inf \Omega_\zeta}^{\sup \Omega_\zeta} |S_0^*(\omega) X(\omega)| \quad \forall \, \omega \in \Omega_\zeta, \qquad (34)$$

where superscript * denotes complex conjugation. And so, $$W_o(\zeta) = \frac{P_{S_0 X}(\zeta)}{R_{S_0 S_0}(\zeta)} \forall \, \zeta. \qquad (35)$$

Accordingly, the matched accompaniment is $$Y(\omega) = W_o(\zeta) S_0(\omega) \forall \omega \in \Omega_\zeta. \qquad (36)$$

The error $E(\omega)$ is calculated in accordance with (21), where p=1, and transformed back to time domain using either the overlap-add or the overlap-save method. The proposed technique may be very efficient, because: the block size of the STFT N may be relatively small, the filter order Z (number of subbands) may be low (Z is equivalent to M from before), and no matrix inversion is required, only division.

IV. Diversity Combining

Now if we depart from the condition of being restricted to the use of the built-in microphone of a tablet computer, we may also consider other forms of external hardware. One alternative is a microphone array. So, let us focus on the case where there are two identical microphones. They shall be placed in close proximity. According to the Nyquist-Shannon theorem, their distance should be shorter than or equal to half the wavelength of the signal component with the highest frequency $f_{max}$. In regard to our test material, we set the upper limit to 8 kHz. The corresponding wavelength $\lambda_{min}$ and distance $\Delta$ are given by $$\lambda_{min} = \frac{c}{f_{max}} \sim \Delta = \frac{\lambda_{min}}{2} = \frac{c}{2 f_{max}}, \qquad (37)$$

where c is the speed of sound. Accordingly, the spacing $\Delta$ is 2.1 cm for an $f_{max}$ of 8 kHz. So, if we place the second microphone along the line between the first microphone and the solo instrument, the delay time between the two microphones amounts to 1/16 of a millisecond, or 3 periods at 44.1-kHz sampling. Also, if we presume that the instrument is 1 m (or more) away from the array, the impinging solo, in good approximation, has the same amplitude at both microphones. The resulting geometry is depicted in FIG. 4.

Figure 4:
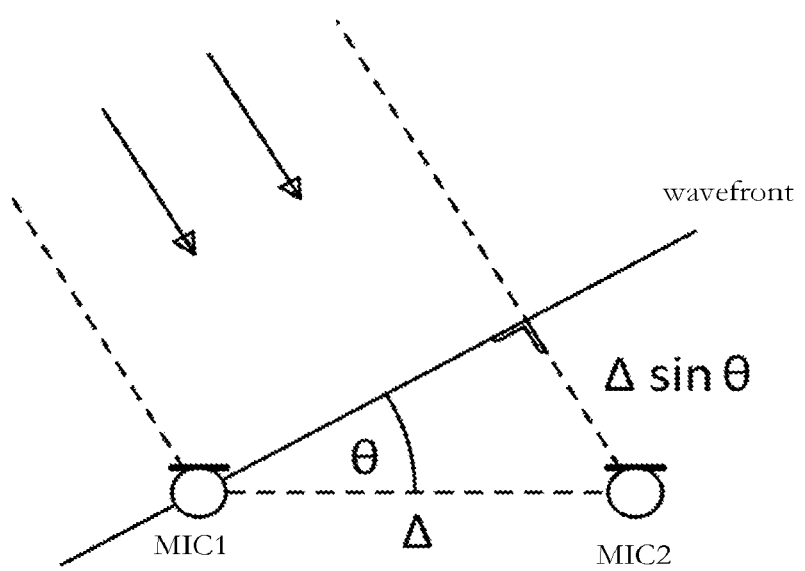
FIG. 4 schematically shows the angle of arrival θ, spacing Δ, and spatial shift Δ sin θ.

FIG. 4 illustrates an array of two microphones MIC1 and MIC2 positioned with a spacing $\Delta$. A sound wavefront arrives from angle of arrival $\theta$. This leads to a spatial shift $\Delta \sin \theta$ between the sound captured by microphone MIC1 and the sound captured by microphone MIC2.

A. Single-Input-Double-Output Signal Model

Based on the above reflections, we amend (22) as follows:

$$\begin{bmatrix} x_1(k) \\ x_2(k) \end{bmatrix} = h(k) * \begin{bmatrix} d_1(k) + s_1(k) \\ d_1(k-\kappa) + s_2(k) \end{bmatrix}, \qquad (38)$$

where $x_1(k)$ and $x_2(k)$ are the signals captured by the array. Only the delay between the two versions of the solo d(k) is taken into account, as it is the signal we seek to enhance. In the Fourier domain, due to the shift theorem, (38) becomes $$\begin{bmatrix} X_1(\omega) \\ X_2(\omega) \end{bmatrix} = H(\omega) \cdot \begin{bmatrix} D_1(\omega) + S_1(\omega) \\ W_N^{\omega \kappa} D_1(\omega) + S_2(\omega) \end{bmatrix} \qquad (39)$$

with $W_N = e^{-j 2\pi/N}$, where $e^{\cdot}$ is the exponential function and j is the imaginary unit. The time shift is equivalent to a phase shift in the Fourier domain, which is a function of $\omega$.

B. Delay Estimation

Looking at (39), one can see that if only the instrument is active, i.e. there is no accompaniment, the two output signals exhibit the following relation in the Fourier domain:

$$X_2(\omega) = W_N^{\omega \kappa} X_1(\omega). \qquad (40)$$

In practice, when using the discrete Fourier transform, which is cyclic, (40) still holds largely true. It is because the delay $\kappa$ is much smaller than the transform size, which is 2048 or 4096 points in the general case. And so, the delay $\kappa$ may be estimated by taking the median of the below observations:

$$\hat{\kappa} = \operatorname*{median}_{\omega}\left[-\arg \frac{X_2(\omega)}{X_1(\omega)} \frac{N}{2\pi \omega}\right] \forall \, \omega. \qquad (41)$$

Alternatively, the delay may be found by selecting the value with the highest number of occurrences in the corresponding histogram. FIG. 4 also shows that the delay can be associated with an angle of arrival $\theta$. The relation is $$\frac{\kappa}{f_s} = \frac{\Delta \sin \theta}{c} \to \theta = \arcsin\left(\frac{f_{max}}{f_s/2} \kappa\right), \qquad (42)$$

where $f_s$ is the sampling frequency and $f_{max} \le f_s/2$.

C. Maximal-Ratio Combining

Maximal-ratio combining (MRC) is one known method of receiver diversity combining. It yields the optimum combiner for independent Gaussian interference. MRC is equivalent to the least-squares (LS) solution of the normal equations $$\left(\begin{bmatrix} 1 \\ W_N^{\omega \kappa} \end{bmatrix}^H \begin{bmatrix} 1 \\ W_N^{\omega \kappa} \end{bmatrix}\right) \hat{D}(\omega) = \begin{bmatrix} 1 \\ W_N^{\omega \kappa} \end{bmatrix}^H \begin{bmatrix} \hat{D}_1(\omega) \\ \hat{D}_2(\omega) \end{bmatrix}, \qquad (43)$$

where superscript H denotes the Hermitian transpose and $$\begin{bmatrix} \hat{D}_1(\omega) \\ \hat{D}_2(\omega) \end{bmatrix} = \begin{bmatrix} E_1(\omega) \\ E_2(\omega) \end{bmatrix}. \qquad (44)$$

i.e., it is the output of cancelling the accompaniment in each channel independently according to Section III-D. The MRC solution can thus be formulated more explicitly as $$\hat{D}(\omega) = \frac{1}{2}[1 \quad W_N^{-\omega\kappa}]\begin{bmatrix} E_1(\omega) \\ E_2(\omega) \end{bmatrix}. \quad (45)$$

Eq. (45) tells us that the signal from the second microphone is counter-rotated by the phase shift, so that the signals from both microphones are combined into a single estimate $\hat{D}(\omega)$, which yields the maximum ratio between the solo signal and the accompaniment residuals after subtraction.

V. Comparison

In this section, we simulate the accompaniment cancellation problem using prerecorded guitar solos in order to assess and compare the solutions that are elaborated in the previous two sections. We consider the speaker to be 25 cm away from the microphone and the sound object, i.e. the guitar amplifier, to be in 100 cm distance. According to the distance law, $$L_{P_2} - L_{P_1} = 20\log_{10}\frac{r_1}{r_2}, \quad (46)$$

we conclude that the sound pressure level (SPL) between the speaker and the guitar amp differs by $\Delta L_p \approx 12.0$ dB. Now, if we postulate that the SPL of the accompaniment is 6.02 dB below the SPL of the guitar amp, the root-mean-square value of the accompaniment in the recorded signal should be 6.02 dB higher than the level of the solo. Such a setting should allow the guitar player, who is deemed to be in the proximity of the amp, to hear his own performance. Note, however, that in the recorded mixture the accompaniment is twice as loud. Other phenomena, such as reverberation or noise, are neglected due to the short distances between the sound sources and the microphone and also for the sake of simplicity. The remaining parameters in (22) and (23) are chosen as follows: the channel delay $\kappa$ is equivalent to 0.72 ms, g(k) is ignored, and A is arbitrary but distinct from the accompaniment level in the mixture. Sony's C37-FET condenser microphone with a reverberation time of 13.7 ms or 606 samples at 44.1-kHz sampling is modeled by the impulse response h(k). Respectively, we choose the filter length M as the next larger power of 2 to leave a margin. As for the reference solo, it is obtained by convolving h(k) with a prerecorded solo signal d(k), see (22). The simulations are run in MATLAB under Windows 8.1 on 20-s mixtures. With respect to the case where we simulate the use of an array of two microphones, their distance is 2.14 cm and the angles of arrival are 21.3° and 90.0°, for the solo and accompaniment, respectively.

A. Algorithms

For comparison, we employ the following algorithms with the following settings. The chosen values were found to give subjectively the best result for each of the algorithms.
ANC: adaptive noise cancellation (see Section II-B), with M=1023 (filter order), $\mu$=0.10 (step size).
ANC': ANC with inverse filtering (see Section II-C), with M=1023 (filter order), $\mu$=0.01 (step size), P=15 (inverse filter order).
MAW: moving-average Wiener filtering (see Section II-D), with M=1023 (filter order), N=16384 (sample size), L=64 (hop size).
MAW': MAW with spectral subtraction (see Section II-E), M=1023 (filter order), N=16384 (sample size), L=64 (hop size), $N_{FFT}$=4096 (FFT size), $L_{FFT}$=2048 (FFT hop size).
SBW: subband Wiener filtering (see Section III-D), and $N_{FFT}$=4096 (FFT size), $L_{FFT}$=2048 (FFT hop size), Z=39 (number of subbands).
SBW': single-input-double-output SBW (see Section IV), $N_{FFT}$=4096 (FFT size), $L_{FFT}$=2048 (FFT hop size), Z=39 (number of subbands).

B. Metrics

As far as an objective quality assessment is concerned, it can be said that there is no consensus across the domain about an over applicable metric for audio enhancement algorithms. As for the various metrics that exist to assess speech quality, one should be aware that they apply only with restrictions. Music is much more complex than speech, to put it crudely. Metrics that came out from the source separation community are still far from the reality of perceived audio quality. Partially, they show a weak correlation or even contradict our perception. For these reasons, we resort to the following metrics. They have shown a certain degree of consistency on numerous occasions. These (and some other) metrics are:
RMSD:
the mean root-mean-square deviation averaged over non-overlapping data blocks of 23 ms duration, $$RMSD = \frac{1}{T\sqrt{N}}\sum_{\tau=1}^{T}\left\{\sum_{k=0}^{N-1}[\hat{d}(k,\tau) - h(k) * d(k,\tau)]^2\right\}^{1/2}, \quad (47)$$

which is averaged over T blocks of length N,
SNRF:
a mean frequency-weighted signal-to-noise ratio averaged over frequency bands and time segments, $$SNRF = \frac{10}{TZ}\sum_{\tau=1}^{T}\sum_{\zeta=1}^{Z}\log_{10}\frac{\Psi_S(\zeta,\tau)}{\Psi_N(\zeta,\tau)}, \quad (48)$$

where $$\Psi_S(\zeta,\tau) = \frac{1}{|\Omega_\zeta|}\sum_{\inf\Omega_\zeta}^{\sup\Omega_\zeta}|H(\omega)D(\omega,\tau)|^2 \quad (49)$$

$\forall\omega\in\Omega_\zeta$ and $$\Psi_N(\zeta,\tau) = \frac{1}{|\Omega_\zeta|}\sum_{\inf\Omega_\zeta}^{\sup\Omega_\zeta}\{[|\hat{D}(\omega,\tau)| - |H(\omega)D(\omega,\tau)|]^2\} \quad (50)$$

$\forall\omega\in\Omega_\zeta$, respectively,
MOS:
a mean opinion score computed with a basic version of PEAQ (acronym for "Perceptual Evaluation of Audio Quality"), and finally
RTF:
the real-time factor, defined as the execution time of the algorithm divided by the signal's duration (measured on an Intel Core i7-4510U CPU operating at 2.00 GHz).

C. Results

The simulation results for one example mixture (called "All Blues") are listed in Table I. Best values are printed in bold.

TABLE I

|  | ANC | ANC' | MAW | MAW' | SBW | SBW' |
|---|---|---|---|---|---|---|
| RMSD [dB] | −31.0 | −31.7 | −32.3 | −36.4 | −37.7 | −37.8 |
| SNRF [dB] | −10.6 | −10.5 | −11.4 | −3.50 | 4.30 | 4.40 |
| MOS | 1.089 | 1.089 | 1.087 | 1.092 | 1.155 | 1.165 |
| RTF | 0.53 | 11.0 | 475 | 449 | 0.06 | 0.15 |

It can be seen that with pre-whitening the numerical similarity slightly improves for adaptive filtering. This, however, has not such a significant impact on the perception-related SNRF metric and the objective MOS, which is the same. The RTF, on the other hand, increases by a factor of 20 and the algorithm no longer runs in real time. Although numerically closer to the original than adaptive filtering, moving-average Wiener filtering in its basic form has a lower perceptual quality. A significant jump both numerically and perceptually can be observed when the matched signal is subtracted from the mixture in the spectral domain. But yet, the improvement surely does not justify the awfully long run time, which is around 400-500 times longer than real time. By far, the clear winner here is the ERB-band Wiener filtering algorithm. It shows the best accompaniment suppression performance, the highest perceptual quality, and it also has a virtually negligible run time.

Diversity improves the estimate only by a narrow margin at the cost of a double execution time (still faster than the adaptive noise canceller). It can be explained by the fact that for the greater part MRC corrects the phase of the estimate, which then again is much less critical as an error source than the magnitude, especially in terms of our perception. As a final remark, we would like to draw the reader's attention to the consistency between the SNRF and MOS trends over all algorithms.

Figure 5A:
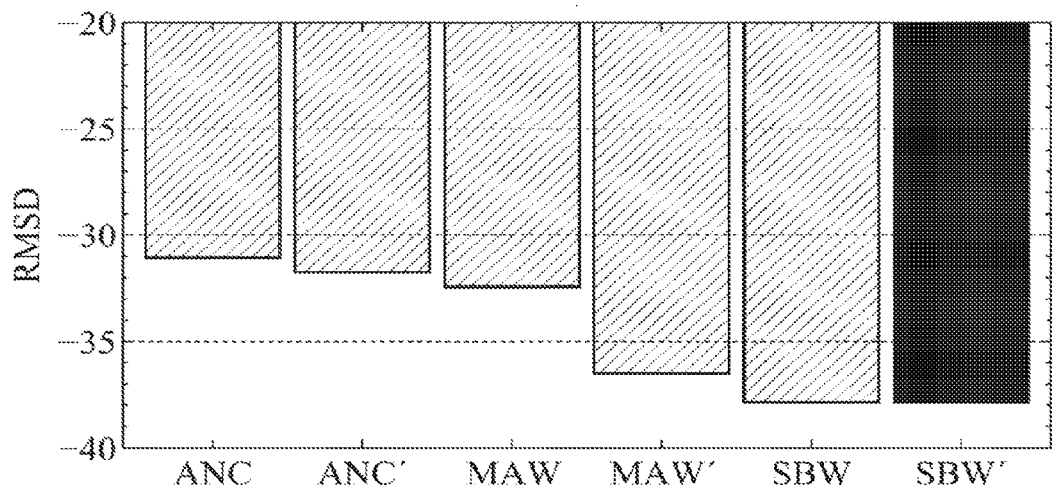
FIGS. 5a, b, c, d illustrate simulation results in a bar diagram.
Figure 5B:
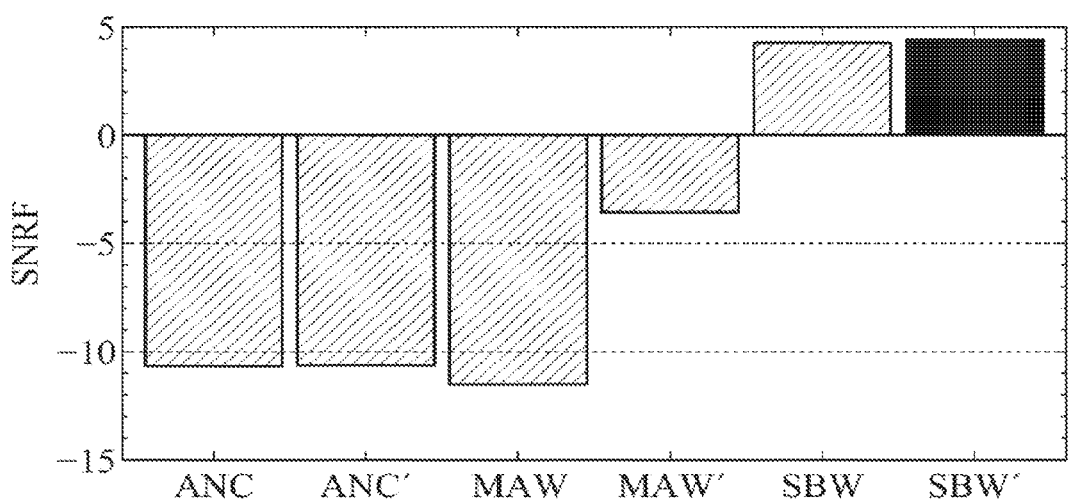
Figure 5C:
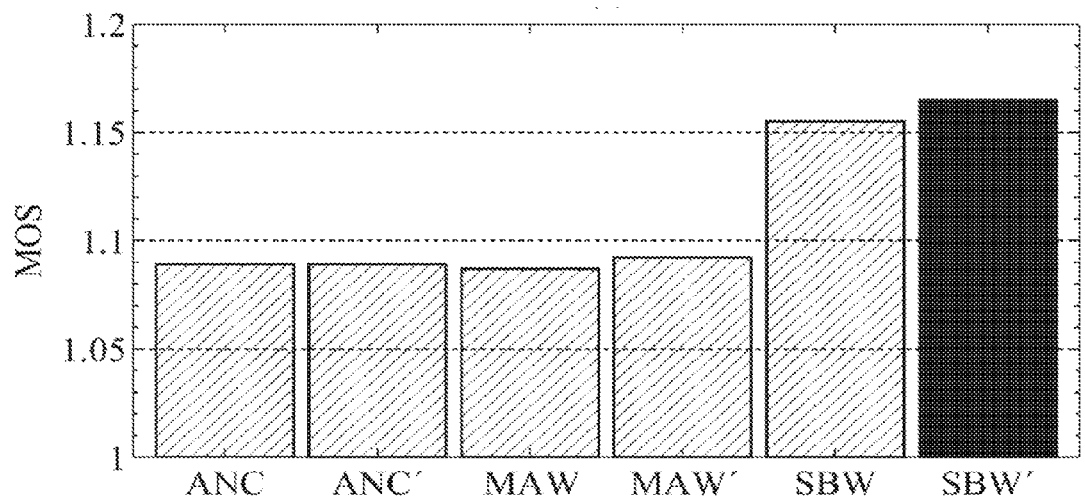
Figure 5D:
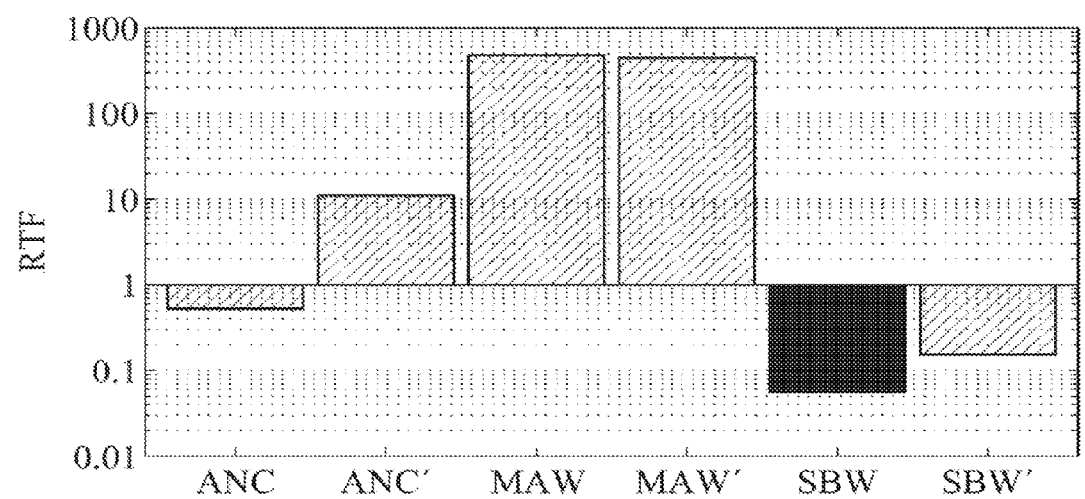

FIGS. 5a, b illustrate the results from Table I in a bar diagram. They provide a comparison between various filtering approaches w.r.t. the chosen performance metrics for "All Blues". Best values correspond to black bars.

VI. Evaluation

Here in this section, we carry out a thorough evaluation of the proposed approach that is based on short-time ERB-band Wiener filtering plus spectral subtraction. For this, and if not otherwise specified, we use the following parameters.

SISO Single-input-single-output: 4096-point fast Fourier transform, 2048-point overlap (50%), 4096-point Kaiser-Bessel derived (KBD) window, standard window shape, classical Wiener filter, equivalent-rectangular-bandwidth (ERB) scale, Manhattan distance (1-norm), equal RMS levels for solo and accompaniment, 32-sample channel delay (uncompensated).

SIDO Single-input-double-output: 2.14-cm distance between microphones, directional alignment with the instrument, solo coming from the front (90°) and accompaniment from the side (0°).

The SIDO case is an extension of the SISO case, and so, all the SISO parameters are the same for both cases. The results of the evaluation are summarized in FIGS. 6-9. Only the first two metrics, the RMSD and the SNRF, are further used.

A. Time and Frequency Resolution

Figure 6A:
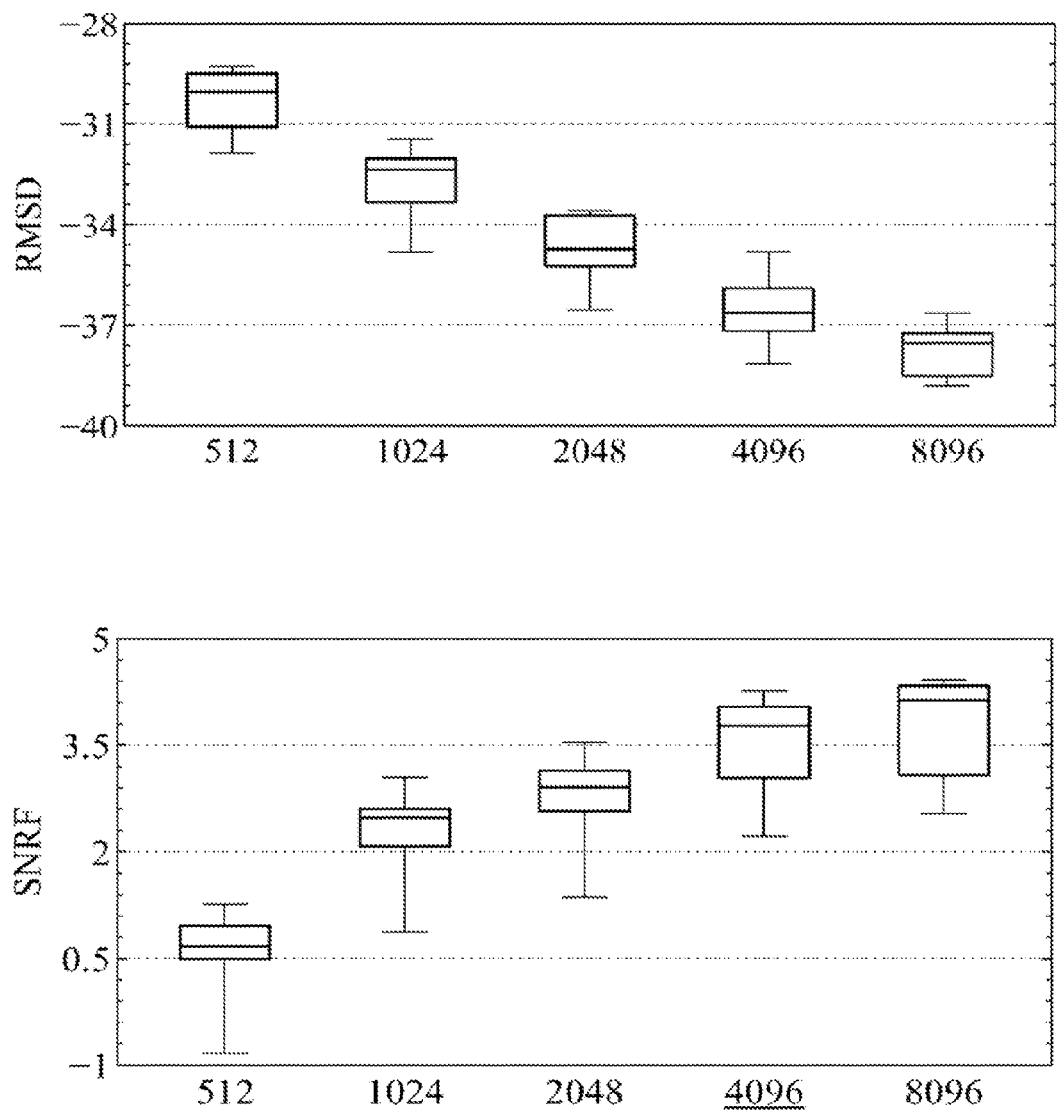
FIGS. 6a, b, c, illustrate the algorithm performance as a function of (a) the FFT size, (b) the shape of the Kaiser-Bessel derived window w.r.t. its free parameter, and (c) the number of non-uniform subbands on a (pseudo-)ERB scale.
Figure 6B:
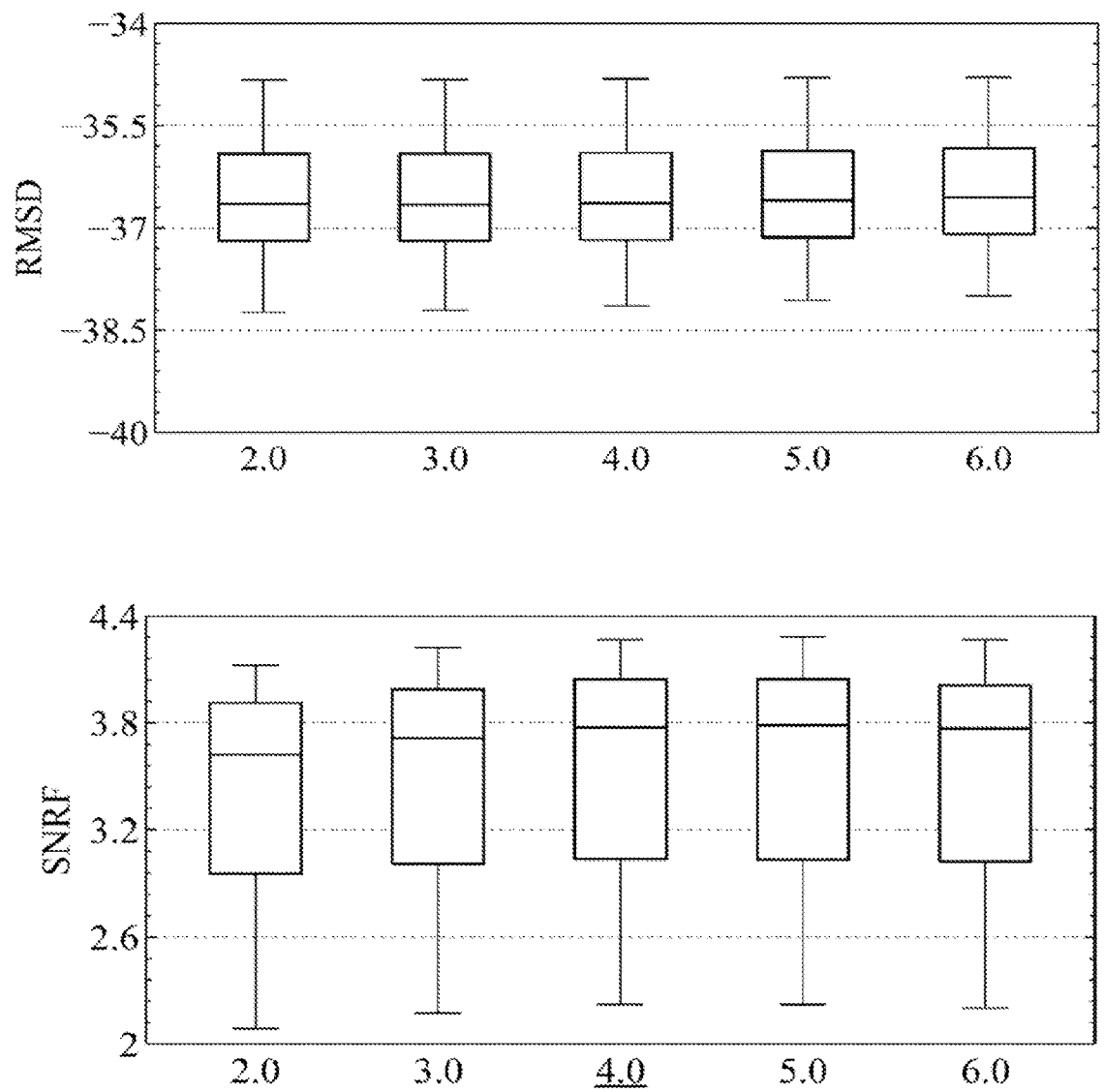
Figure 6C:
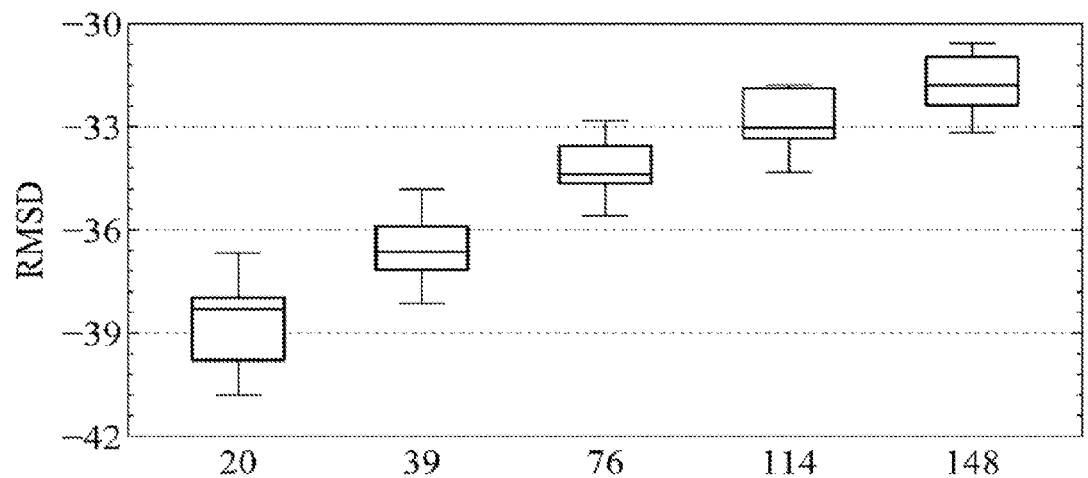
Figure 6C:
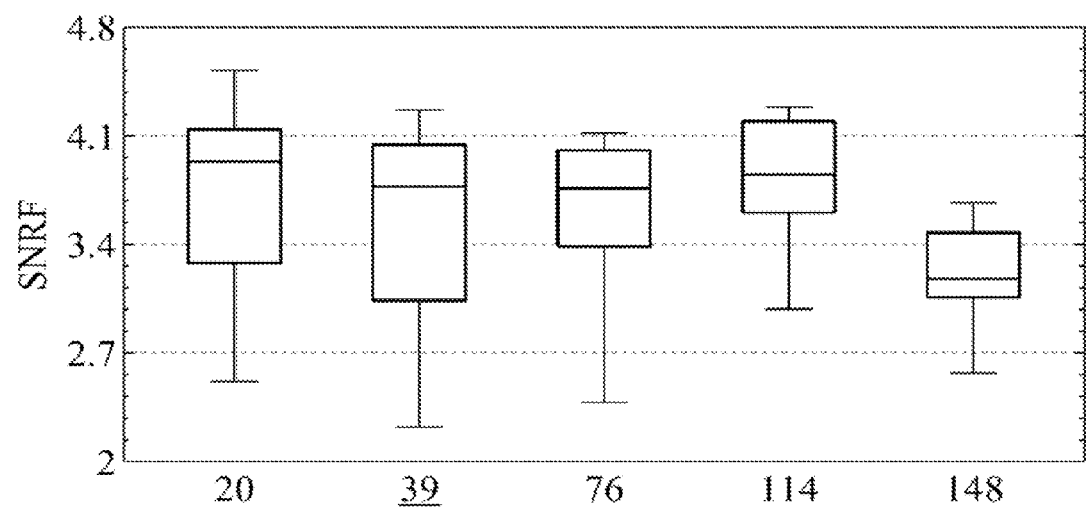

FIGS. 6a, b, c illustrate the algorithm performance as a function of (a) the FFT size, (b) the shape of the Kaiser-Bessel derived window w.r.t. its free parameter, and (c) the number of non-uniform subbands on a (pseudo-)FRB scale. Suggested values are underlined. On each box, the central mark is the median and the edges of the box are the 25th and 75th percentiles. The whiskers extend to the most extreme data points including outliers.

FIG. 6a gives rise to the impression that the similarity of the estimate increases with the length of the transform. If we look at the SNRF alone, however, we notice that it begins to saturate after a value of 4096. If we listen to the estimate, it is clearly audible that the attacks of the played notes largely disappear if we further increase the window. For this and for the reason of memory requirements, we suggest a 4096-point DFT. The shape of the window appears to be a minor issue. Thus, we recommend to use the standard value for its shape parameter, which is 4, see also FIG. 6b. With regard to the division of the frequency axis into nonuniform subbands, we may say the following the number of subbands depends on one's preference and the application. A lower number preserves more of the original signal, but also lets more interference leak in. A higher number, on the other hand, deals well with interference, yet takes away the crisp details from the original sound. For this reason, a too low or too high number of subbands should be avoided. We suggest to use the standard ERB scale that has 39 bands at 44.1-kHz sample rate and 16-kHz cutoff, see also FIG. 6c.

B. Filtering and Subtraction

Figure 7A:
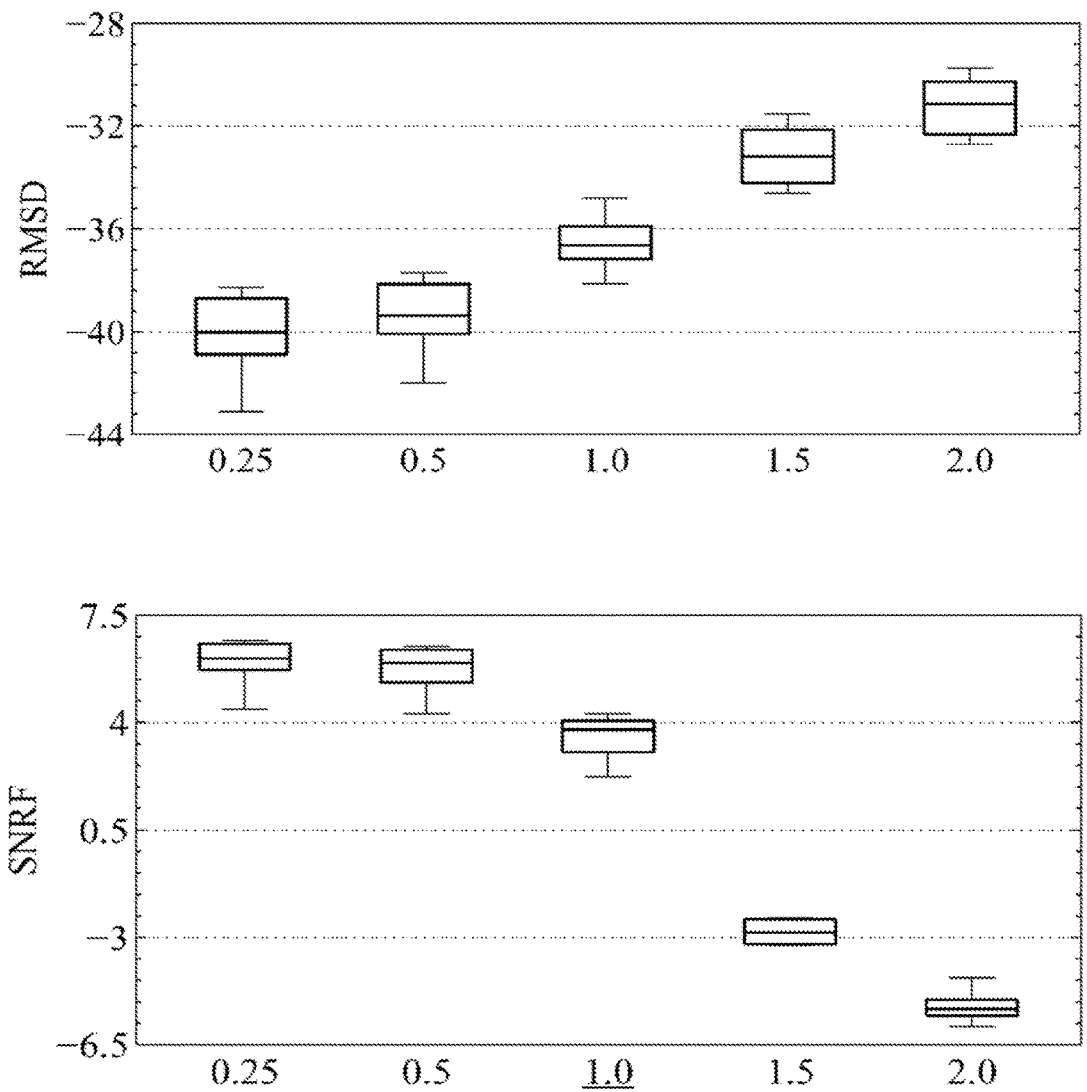
FIG. 7a, b illustrate the algorithm performance as a function of (a) the exponent of the Wiener filter and (b) the spectral p-norm of the estimate.

FIGS. 7a, b illustrate the algorithm performance as a function of (a) the exponent of the Wiener filter and (b) the spectral p-norm of the estimate, see (21). An exponent equal to 1.0 yields the Wiener filter in (35). An exponent equal to 0.5 yields the square-root Wiener filter. A p-value of 2 represents the Euclidean distance and a p-value of 1 represents the Manhattan distance, respectively. Suggested values are underlined. On each box, the central mark is the median and the edges of the box are the 25th and 75th percentiles. The whiskers extend to the most extreme data points including outliers.

What is said in the preceding paragraph also applies to the Wiener filter, i.e., there is a compromise to make. If the goal is to reduce the estimate's spectrum to its fewer components with a higher signal-to-interference ratio, the filter should be taken to a power lower than 1, see FIG. 7a. However in our opinion, the classical Wiener filter is a safer bet, since it can sufficiently attenuate interference, while keeping most of the signal's fine structure intact.

Figure 7B:
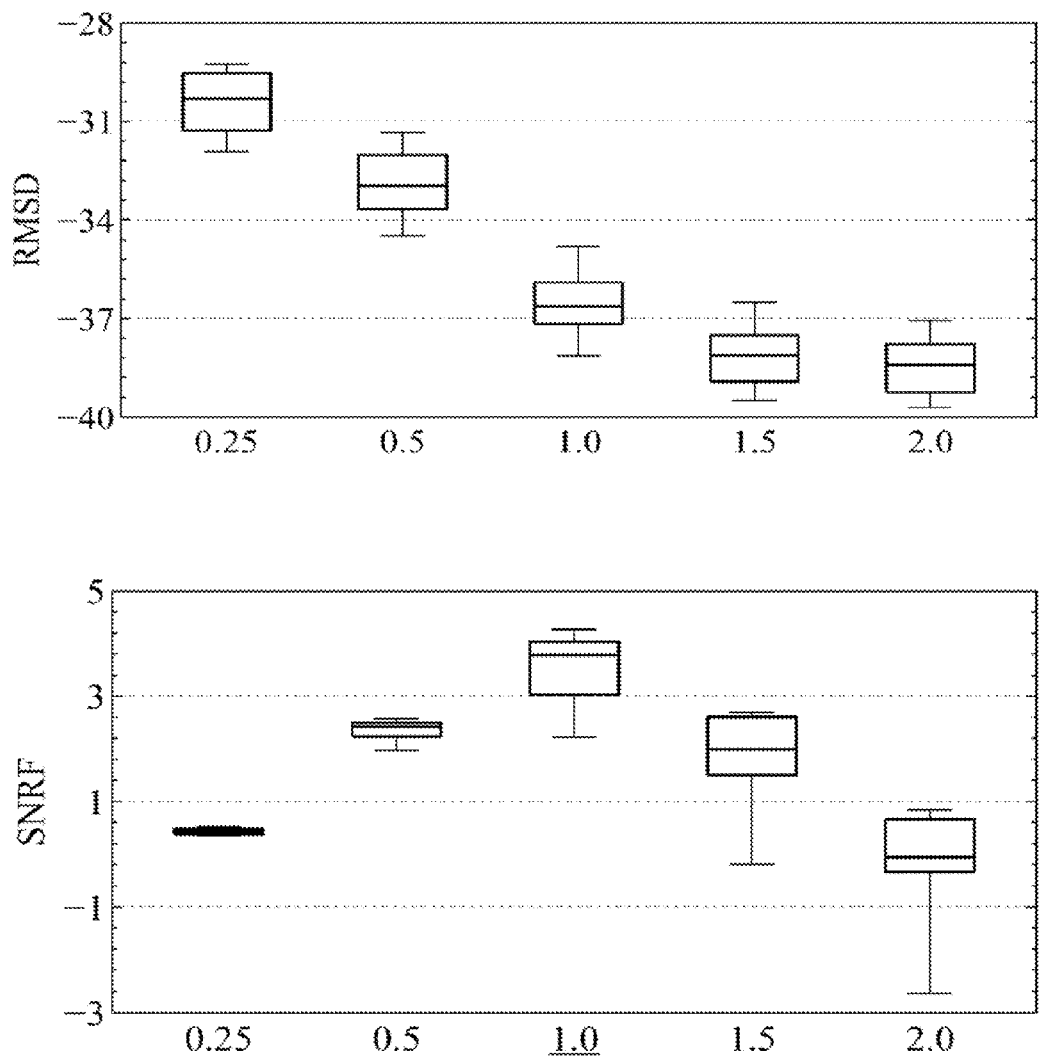

On the contrary, FIG. 7b leaves no doubt about the most performant distance metric. It is the 1-norm, which is known as the Manhattan distance. Note that the 1-norm outperforms the 2-norm perceptually, even though the 2-norm is naturally associated with the underlying statistical model.

C. Distance and Channel Delay

Figure 8A:
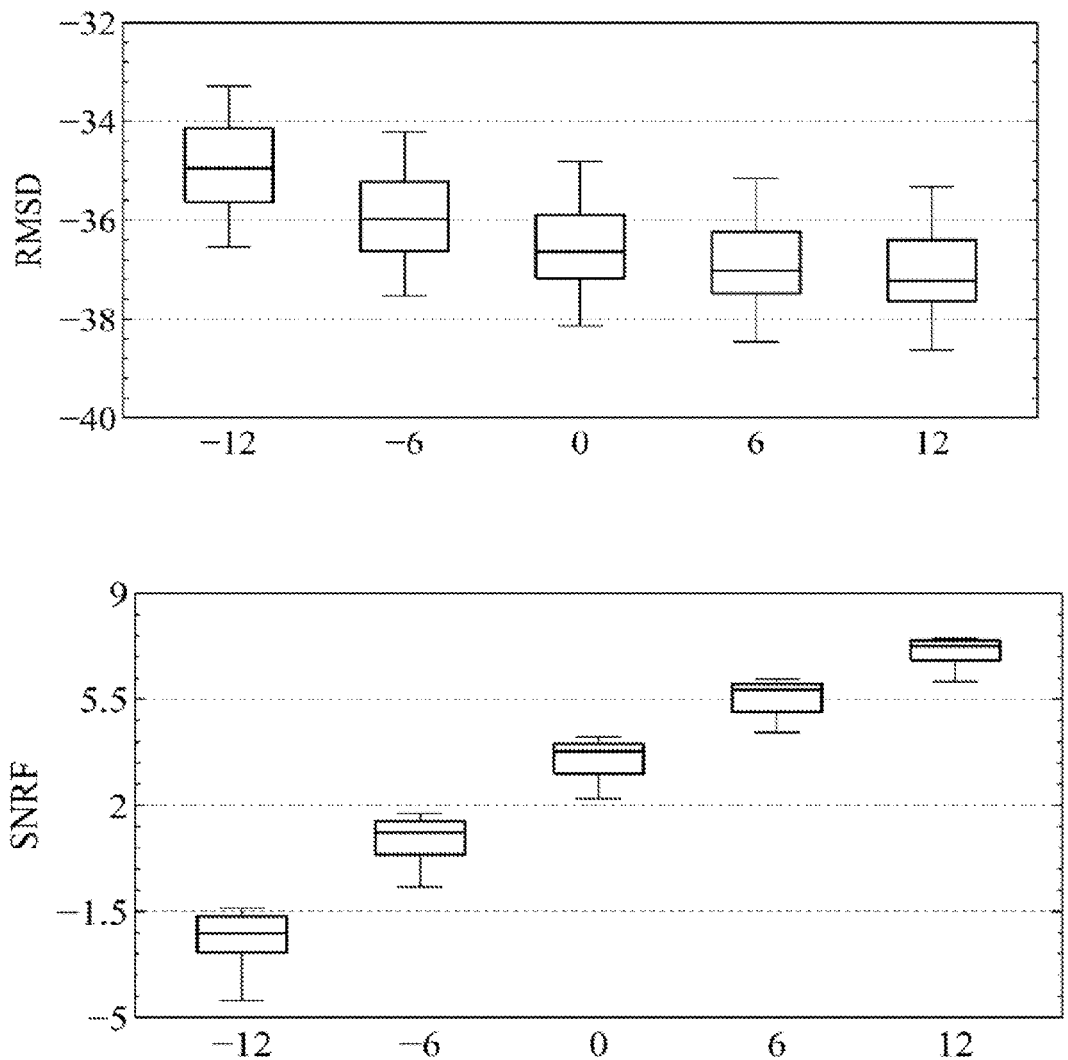
FIG. 8a, b illustrate the algorithm performance as a function of (a) the RMS level (or SPL) difference in decibel between the recorded solo and accompaniment and (b) the delay (samples) mismatch in the channel model.

FIGS. 8a, b illustrate the algorithm performance as a function of (a) the RMS level (or SPL) difference in decibel between the recorded solo and accompaniment and (b) the delay (samples) mismatch in the channel model. On each box, the central mark is the median and the edges of the box are the 25th and 75th percentiles. The whiskers extend to the most extreme data points including outliers.

FIG. 8a simply confirms the blatantly obvious: the quality of the estimate is much higher, when the instrument is closer to the microphone or louder than the speaker. This leads to a higher solo-to-accompaniment ratio in the recording, and so, the subtracted accompaniment estimate leaves less traces.

Figure 8B:
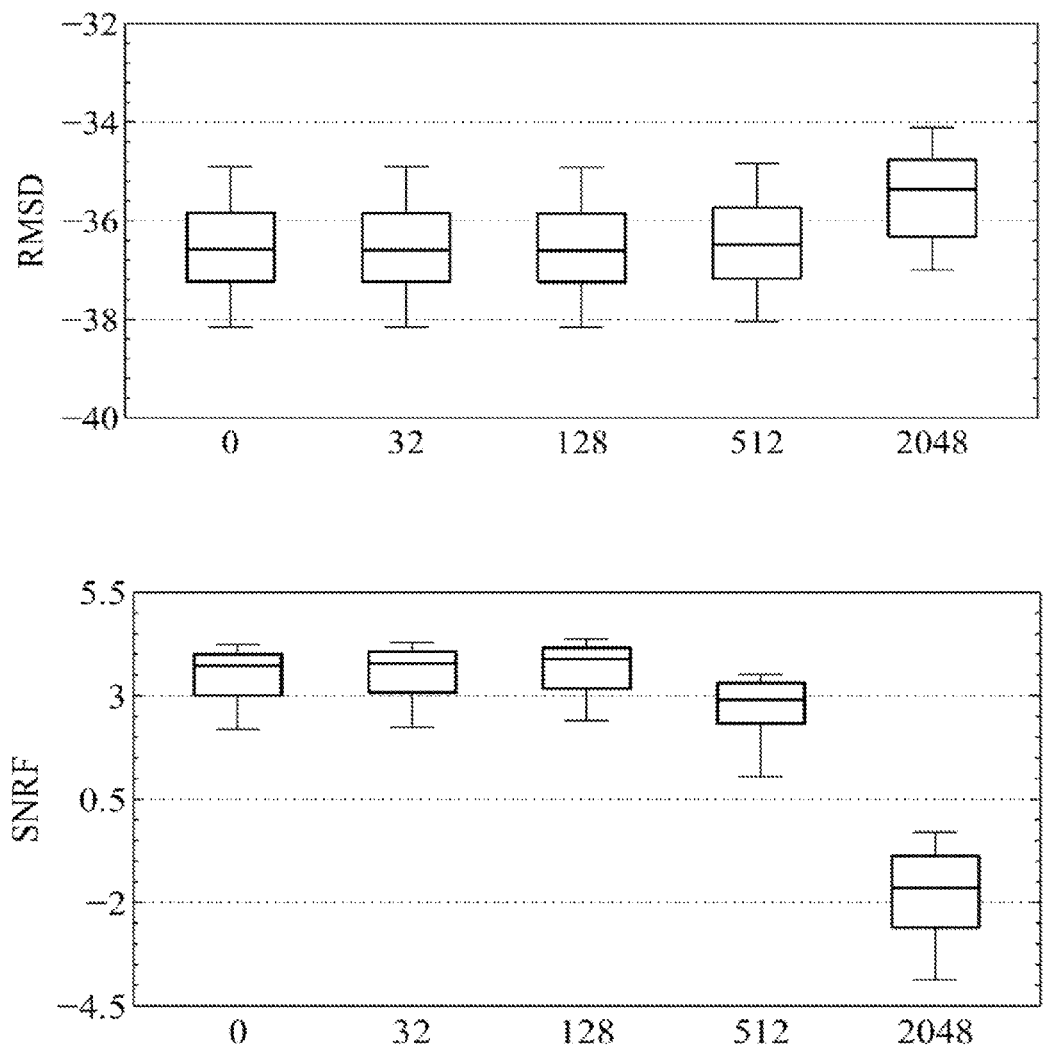

More interesting, however, is FIG. 8b. It says that as long as the channel delay between the speaker and the microphone is much shorter than the transform length, its impact is null. This can be assumed to be the case for a tablet computer. It should still be noted that hardware delay may have a (much) greater impact depending on its latency time.

D. Spatial Alignment

Figure 9A:
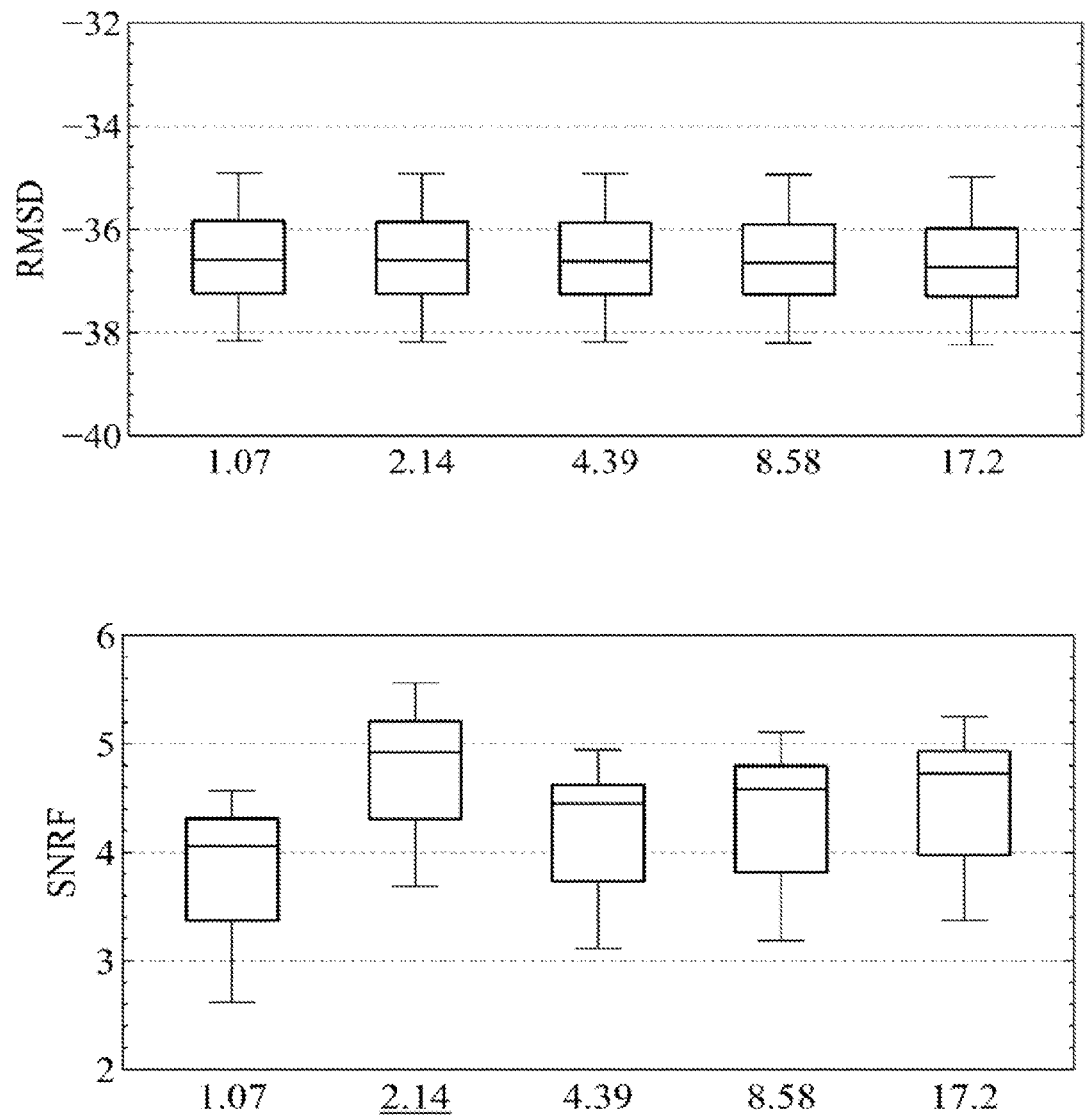
FIGS. 9a,b illustrate the algorithm performance as a function of (a) the distance between the microphones and (b) the angular mismatch in degrees between the true and the estimated direction of arrival of the solo.

FIGS. 9a,b illustrate the algorithm performance as a function of (a) the distance between the microphones and (b) the angular mismatch in degrees between the true and the estimated direction of arrival of the solo. The underlined value corresponds to half-wave spacing for a frequency of 8 kHz at 44.1-kHz sample rate. On each box, the central mark is the median and the edges of the box are the 25th and 75th percentiles. The whiskers extend to the most extreme data points including outliers.

Looking at FIG. 9a it seems that in the case where a pair of microphones is utilized to capture the composite signal in conjunction with maximal-ratio combining, the spacing is of vital importance. In our test, MRC performed best when the spacing between the microphones was equal to half the wave length of an 8-kHz signal. Especially w.r.t. transient artifacts, the enhancement was clearly noticeable.

Figure 9B:
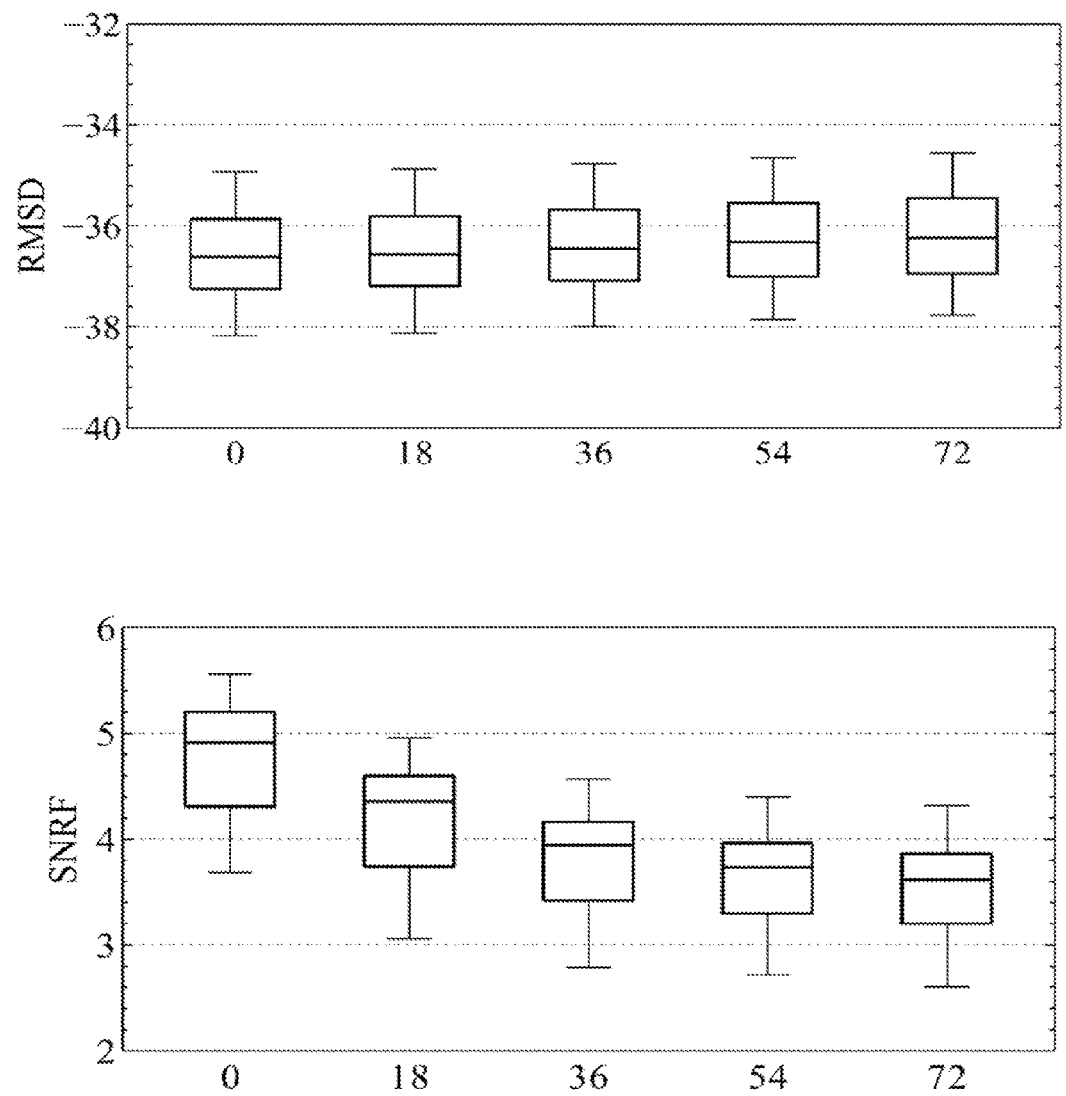

Finally, FIG. 9b shows that a significant deviation in the angle estimate (related to the position of the guitar amplifier) is detrimental to sound quality. Nevertheless, a small error is certainly tolerable in most cases.

E. General Remarks

While the RMSD indicates a numerical deviation between the estimated and the desired signal, the SNRF is capable of capturing the perceptual component of an audio signal. If we look at the figures where we underlined the values for which we think the algorithm works best, we may observe that our perception correlates with the SNRF metric quite strongly. In consequence, we propose to employ the SNRF as a standard metric for similar tasks. Nevertheless, we would like to point out that the SNRF has a tendency to give a high score to an estimate in which the noise or interference is suppressed to a very high degree. The corresponding signal may be perceived as condensed or less natural by the listener. From a machine perspective then again, the signal might be easier to analyze, since it contains the most dominant components, and what is more, the latter are associated with a low error.

In regard to the improvement that is achievable with a pair of microphones, or a microphone array in general, we would like to add the following. MRC as a post-processor is meant to correct the phase of the estimate after the accompaniment was subtracted from each channel separately. This has for effect a reduction of transient interference. As a rule, these transients are suppressed insufficiently by the core algorithm, because the transform is applied to a long window and because the sample covariance between the spectra of a note and a percussive hit has a high magnitude.

Altering the phase of the estimate, MRC essentially destroys the phase of the transient residual, which hence becomes not so or simply less prominent. According to some embodiments, the array is aligned with the spatial acoustics, as shown in FIG. 9. The achievable gain appears to be meager, particularly in view of the fact that additional hardware is necessary. A pragmatic solution would consist in using a guitar pickup or placing an external microphone close to the instrument or the amplifier, so that the recording exhibits a low interference. This would improve the estimate more than MRC, see FIG. 8a.

Figure 3:
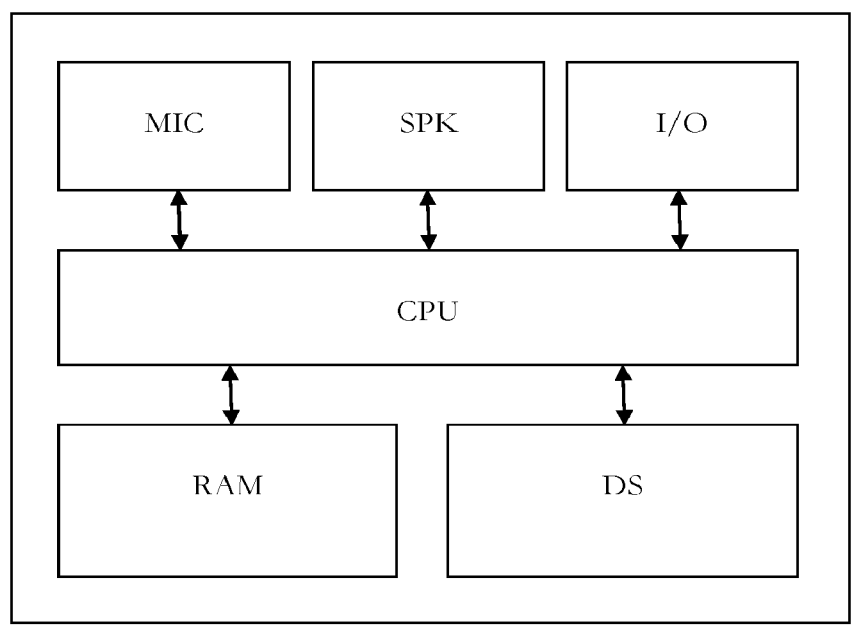
FIG. 3 schematically describes an electronic device according to an embodiment of the invention.

FIG. 3 schematically describes an electronic device according to an embodiment of the invention. The electronic device may be a personal computer, a laptop, a tablet computer, a smartphone, a game station or the like. The electronic device comprises a central processor CPU, a Random-Access-Memory RAM, a disk storage DS (such as a hard disk drive, and/or an optical disk drive, or the like), an Input/Output interface I/O (such as an Ethernet interface, a WLAN interface, a Bluetooth interface, and/or, USB-port, etc) for communicating with external devices or the Internet. The electronic device further comprises a microphone MIC for capturing sound signals, and a speaker SPK for producing sound signals. Entities as for example the audio player and/or audio renderer may be implemented as software stored on the disk storage and/or (temporally) in the RAM. Entities like the microphone MIC, the speaker SPK and the disk storage DS might as well be located outside the electronic device, but connected to the electronic device.

Figure 10:
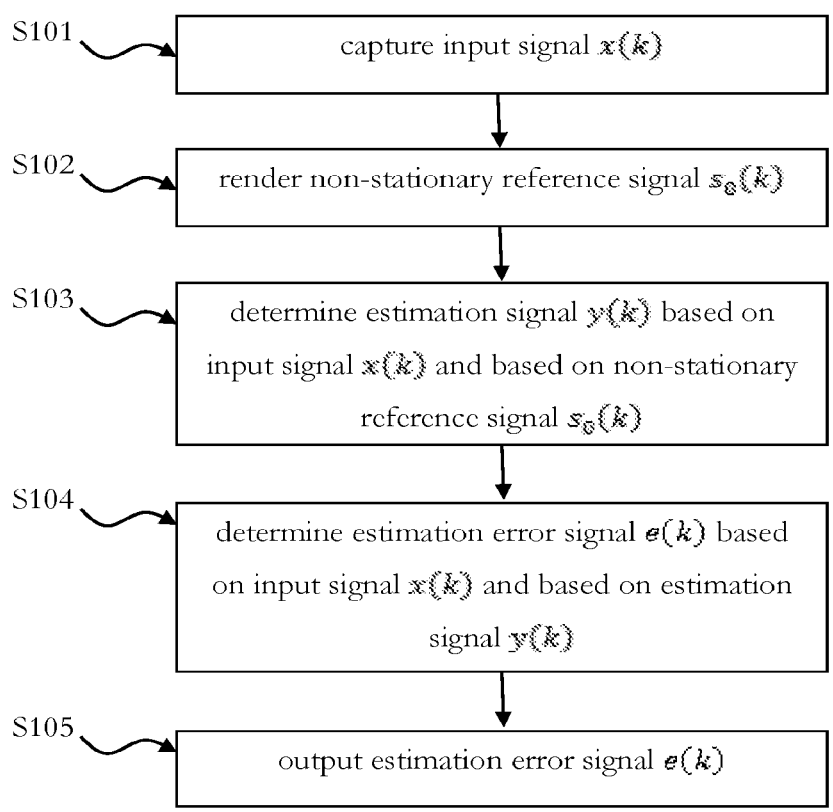
FIG. 10 schematically describes a method according to an embodiment of the invention.

FIG. 10 schematically describes a method according to an embodiment of the invention. At S101, an input signal $x(k)$ is captured. At S102, a non-stationary reference signal $s_0(k)$ is rendered. At S103, an estimation signal $y(k)$ is determined based on input signal $x(k)$ and based on non-stationary reference signal $s_0(k)$. At S104, an estimation error signal $e(k)$ is determined based on the input signal and based on the estimation signal $y(k)$. At S105, the estimation error signal $e(k)$ is output. The determination of the estimation signal $y(k)$ in S103 and the determination of the estimation error signal $e(k)$ in S104 can be performed according to the principles described in the disclosure above.

Music signals pose a challenge for the existing theory on statistical signal processing. This is due to its band width, its spectral dynamics, and its non-stationarity. The above disclosure shows that the convergence rate of the LMS filter is not fast enough to keep pace with transient music signals. Inverse filtering is a help but costs too much and the result is not satisfactory. A Wiener-type filter is better, but only if the difference signal is computed in the frequency domain. It is, however, intractable from a computational point of view. A short-time Wiener can be viewed as the best and the cheapest solution, especially if the filtering is carried out in ERB-bands.

When using a microphone array, maximal-ratio combining can reduce the audible artifacts due to residual transients that reside in the solo after accompaniment cancellation. For this, the array should be aligned with the instrument. The spacing between the array elements is also important. The quality of the solo mainly depends on the distance of the sound source w.r.t. the sink: The closer the instrument to the microphone or, more generally speaking, the louder the instrument in the recorded signal, the higher the quality of the solo. On a final note, the SNRF appears to be sufficiently correlated with perception to predict relative tendencies. Therefore, we recommend it as a reference metric for the assessment of quality for speech and audio.

The skilled person will also recognize that the embodiments describe methods with an exemplary ordering of method steps. The specific ordering of method steps is however given for illustrative purposes only and should not be construed as binding. For example the ordering of S101 and S102 in the embodiment of FIG. 10 may be exchanged.

The skilled person will also recognize that the division of the electronic device of FIG. 3 into units MIC, SPK, I/O, CPU, RAM, and DS is only made for illustration purposes and that the present disclosure is not limited to any specific division of functions in specific units. For instance, the I/O component of FIG. 3 could be implemented as part of a CPU by a respective programmed processor, field programmable gate array (FPGA) and the like. Likewise a CPU can comprise internal RAM, for example in form of a cache.

The skilled person will also recognize that although FIG. 3 shows only one microphone MIC as component of the electronic device, multiple microphones may be implemented in or together with the electronic device. For example, in a Single-Input-Double-Output scenario as described in section IV-A, two microphones MIC1 and MIC2 may be employed.

The skilled person will also recognize that in alternative embodiments, some of the components of the electronic device of FIG. 3 may be located outside of the electronic device. For example an external microphone MIC or an external disk storage DS may be connected to the electronic device.

The methods described here can also be implemented as a computer program causing a computer and/or a processor, such as the CPU in the electronic device of FIG. 3 discussed above, to perform the method, when being carried out on the computer and/or processor. In some embodiments, also a non-transitory computer-readable recording medium is provided that stores therein a computer program product, which, when executed by a processor, such as the processor described above, causes the method described to be performed.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing electronic device, it will be appreciated that a computer program providing such software control and a transmission, storage or other medium by which such a computer program is provided are envisaged as aspects of the present disclosure.

It should also be recognized that the present technology can also be configured as described below.

(1) An electronic device comprising: a processor arranged to determine an estimation signal (y(k)) based on an input signal (x(k)) and a non-stationary reference signal ($s_0$(k)).

(2) The electronic device of (1) wherein the input signal (x(k)) is composed of a modified version of the non-stationary reference signal (h(k)*s(k)) and a signal of interest (h(k)*d(k)).

(3) The electronic device of (2) wherein the modified version of the non-stationary reference signal (h(k)*s(k)) corresponds to a recorded accompaniment and the signal of interest (h(k)*d(k)) corresponds to a recorded solo.

(4) The electronic device of anyone of (1) to (3) wherein the non-stationary reference signal ($s_0$(k)) is a predefined audio accompaniment signal.

(5) The electronic device of anyone of (1) or (4) wherein the processor is further arranged to render the non-stationary reference signal ($s_0$(k)) based on an audio file and/or based on an automatic accompaniment generation engine.

(6) The electronic device of anyone of (1) to (5) wherein the processor is further arranged to determine the estimation signal (y(k)) by applying moving-average Wiener filtering.

(7) The electronic device of anyone of (1) to (6) wherein the processor is further arranged to determine an auto-covariance matrix ($\hat{R}_{s_0 s_0}$(k)) for the non-stationary reference signal ($s_0$(k)), and to determine a cross-covariance matrix for the input signal (x(k)) and the non-stationary reference signal ($s_0$(k)).

(8) The electronic device of anyone of (1) to (7) wherein the processor is further arranged to determine optimal filter weights ($w_o$(k)) based on the auto-covariance matrix ($\hat{R}_{s_0 s_0}$(k)) and based on the cross-covariance matrix ($\hat{p}_{s_0 x}$(k)).

(9) The electronic device of anyone of (1) to (8) wherein the processor is further arranged to determine the estimation signal (y(k)) by applying short-time subband Wiener filtering.

(10) The electronic device of anyone of (1) to (9) wherein the processor is further arranged to transform the non-stationary reference signal ($s_0$(k)) and the input signal (x(k)) into the frequency-domain in order to obtain a frequency-domain reference signal ($S_0(\omega)$), and, respectively, a frequency-domain input signal ($X(\omega)$).

(11) The electronic device of anyone of (1) to (10) wherein the processor is further arranged to form subbands ($\Omega_\zeta$) on the equivalent rectangular bandwidth rate scale.

(12) The electronic device of (11) wherein the processor is further arranged to determine centroids ($S_0(\zeta)$, $X(\zeta)$) of the frequency-domain reference signal ($S_0(\omega)$), and, respectively, the frequency-domain input signal ($X(\omega)$) in the subbands ($\Omega_\zeta$).

(13) The electronic device of (12) wherein the processor is further arranged to determine a frequency-domain estimation signal ($Y(\omega)$) based on the centroids ($S_0(\zeta)$, $X(\zeta)$).

(14) The electronic device of anyone of (1) to (13) wherein the processor is further arranged to determine the estimation signal (y(k)) based on a single-input-double-output signal model.

(15) The electronic device of anyone of (1) to (14) wherein the processor is further arranged to determine an estimation error signal (e(k)) based on the observed signal (x(k)) and based on the estimation signal (y(k)).

(16) The electronic device of (15) wherein the processor is further arranged to determine the estimation error signal (e(k)) by subtracting the estimation signal (y(k)) and the observed signal (x(k)) in the spectral domain.

(17) The electronic device of (15) or (16) wherein the processor is further arranged to output the estimation error signal (e(k)) as an estimated audio solo signal.

(18) The electronic device of anyone of (1) to (17), further comprising a microphone for capturing the input signal (x(k)).

(19) A method comprising:
  determining an estimation signal (y(k)) based on an input signal (x(k)) and based on a non-stationary reference signal ($s_0$(k), $\tilde{s}_0$(k)).

(20) The method of (19) wherein the input signal (x(k)) is composed of a modified version of the non-stationary reference signal (h(k)*s(k)) and a signal of interest (h(k)*d(k)).

(21) The method of (20) wherein the modified version of the non-stationary reference signal (h(k)*s(k)) corresponds to a recorded accompaniment and the signal of interest (h(k)*d(k)) corresponds to a recorded solo.

(22) Any method of (19) to (21) wherein the non-stationary reference signal ($s_0$(k)) is a predefined audio accompaniment signal.

(23) The method of anyone of (19) or (22) further comprising rendering the non-stationary reference signal ($s_0$(k)) based on an audio file and/or based on an automatic accompaniment generation engine.

(24) The method of anyone of (19) to (23) further comprising determining the estimation signal (y(k)) by applying moving-average Wiener filtering.

(25) The method of anyone of (19) to (24) further comprising determining an auto-covariance matrix ($\hat{R}_{s_0 s_0}$(k)) based on the non-stationary reference signal ($s_0$(k)), and to determine a cross-covariance matrix based on the input signal ($x(k)$) and the non-stationary reference signal ($s_0(k)$).

(26) The method of anyone of (19) to (25) further comprising determining optimal filter weights ($w_o(k)$) based on the auto-covariance matrix ($\hat{R}_{s_0 s_0}(k)$) and based on the cross-covariance matrix ($\hat{p}_{s_0 x}(k)$).

(27) The method of anyone of (19) to (26) further comprising determining the estimation signal ($y(k)$) by applying short-time subband Wiener filtering.

(28) The method of anyone of (19) to (27) further comprising transforming the non-stationary reference signal ($s_0(k)$) and the input signal ($x(k)$) into the frequency-domain in order to obtain a frequency-domain reference signal ($S_0(\omega)$), and, respectively, a frequency-domain input signal ($X(\omega)$).

(29) The method of anyone of (19) to (28) further comprising forming subbands ($\Omega_\zeta$) on the equivalent rectangular bandwidth rate scale.

(30) The method of (29) further comprising determining centroids ($S_0(\zeta)$, $X(\zeta)$) of the frequency-domain reference signal ($S_0(\omega)$), and, respectively, the frequency-domain input signal ($X(\omega)$) in the subbands ($\Omega_\zeta$).

(31) The method of (30) further comprising determining a frequency-domain estimation signal ($Y(\omega)$) based on the centroids ($S_0(\zeta), X(\zeta)$).

(32) The method of anyone of (19) to (31) determining the estimation signal ($y(k)$) based on a single-input-double-output signal model.

(33) The method of anyone of (19) to (32) further comprising determining an estimation error signal ($e(k)$) based on the observed signal ($x(k)$) and based on the estimation signal ($y(k)$).

(34) The method of (33) further comprising determining the estimation error signal ($e(k)$) by subtracting the estimation signal ($y(k)$) and the observed signal ($x(k)$) in the spectral domain.

(35) The method of (33) or (34) further comprising outputting the estimation error signal ($e(k)$) as an estimated audio solo signal.

(36) The method of anyone of (19) to (35), further comprising capturing the input signal ($x(k)$) with a microphone.

(37) A computer program comprising instructions, the instructions when executed on a processor causing the processor to:
determine an estimation signal ($y(k)$) based on an input signal ($x(k)$) and based on a non-stationary reference signal ($s_0(k)$, $\tilde{s}_0(k)$).

(38) A computer program comprising instructions, the instructions when executed on a processor causing the processor to perform the method of anyone of (19) to (36).

(39) A non-transitory computer-readable recording medium that stores therein a computer program product, which, when executed by a processor, causes the method according to anyone of (19) to (36) to be performed.

REFERENCE SIGNS

MIC Microphone
SPK Speaker
CPU Central Processing Unit
RAM Random-Access Memory
DS Disk Storage
I/O Input/Output
$x(k)$ input signal (observed signal)
$X(\omega)$ input signal (frequency-domain)
$s(k)$ accompaniment contribution to $x(k)$
$d(k)$ solo contribution to $x(k)$
$s_0(k)$ non-stationary reference signal (reference accompaniment)
$\tilde{s}_0(k)$ inverse filtered non-stationary reference signal
$S_0(\omega)$ reference signal (frequency-domain)
$y(k)$ estimation signal (matched accompaniment)
$Y(\omega)$ estimation signal (frequency-domain)
$e(k)$ estimation error signal (estimate of solo)
$E(\omega)$ estimation error signal (frequency-domain)
$g(k)$ speaker function
$h(k)$ impulse response of microphone
$\kappa$ delay
$A$ attenuation
$w(k)$ filter weights (transversal finite impuls response or FIR filter)
$w_o(k)$ optimal filter weights
$\hat{R}_{s_0 s_0}(k)$ auto-covariance matrix (sample estimates)
$\hat{p}_{s_0 x}(k)$ cross-covariance matrix (sample estimates)
$\Omega_\zeta$ subband $\zeta$
$\zeta$ (subband index ($\zeta=1, \ldots, Z$)
$Z$ total number of subbands
$S_0(\zeta)$ subband centroids of non-stationary reference signal (time-domain)
$X(\zeta)$ subband centroids of input signal (time-domain)

The invention claimed is:

1. An electronic device, comprising:
a microphone; and
a processor arranged to
control the microphone to acquire an input audio signal;
determine an auto-covariance matrix based on a non-stationary reference audio signal;
determine a cross-covariance matrix based on the input audio signal and the non-stationary reference audio signal;
determine an estimation audio signal based on the auto-covariance matrix and the cross-covariance matrix; and
output the estimation audio signal based on the determining, wherein
the input audio signal includes a modified version of the non-stationary reference audio signal and an audio signal of interest,
the modified version of the non-stationary reference audio signal is an audio accompaniment signal, and
the audio signal of interest is a solo audio signal.

2. The electronic device of claim 1, wherein the audio accompaniment signal is a predefined audio accompaniment signal.

3. The electronic device of claim 1, wherein the processor is further arranged to render the non-stationary reference audio signal based on an audio file and/or based on automatic accompaniment generation engine.

4. The electronic device of claim 1 wherein the processor is further arranged to determine the estimation audio signal by applying moving-average Wiener filtering.

5. The electronic device of claim 1 wherein the processor is further arranged to determine optimal filter weights based on the auto-covariance matrix and based on the cross-covariance matrix.

6. The electronic device of claim 1 wherein the processor is further arranged to determine the estimation audio signal by applying short-time subband Wiener filtering.

7. The electronic device of claim 1, wherein the processor is further arranged to determine the estimation audio signal based on a single-input-double-output signal model.

8. The electronic device of claim 1, wherein the processor is further arranged to determine an estimation error signal based on the observed signal and based on the estimation audio signal.

9. The electronic device of claim 8, wherein the processor is further arranged to determine the estimation error signal by subtracting the estimation audio signal and the observed signal in the spectral domain.

10. The electronic device of claim 8, wherein the processor is further arranged to output the estimation error signal as an estimated audio solo signal.

11. An electronic device, comprising:
a microphone; and
a processor arranged to
control the microphone to acquire an input audio signal;
transform a non-stationary reference audio signal and the input audio signal into the frequency-domain in order to obtain a frequency-domain reference signal, and, respectively, a frequency-domain input signal;
form subbands on the equivalent rectangular bandwidth rate scale;
determine centroids of the frequency-domain reference signal, and, respectively, the frequency-domain input signal in the subbands;
determine a frequency-domain estimation audio signal based on the centroids; and
output the frequency-domain estimation audio signal, wherein the input audio signal includes a modified version of the non-stationary reference audio signal and an audio signal of interest,
the modified version of the non-stationary reference audio signal is an audio accompaniment signal, and
the audio signal of interest is a solo audio signal.

12. A method, comprising:
acquiring, by a microphone, an input audio signal;
determining an auto-covariance matrix based on a non-stationary reference audio signal;
determining a cross-covariance matrix based on the input audio signal and the non-stationary reference audio signal;
determining an estimation audio signal based on the auto-covariance matrix and the cross-covariance matrix; and
outputting the estimation audio signal based on the determining, wherein
the input audio signal includes a modified version of the non-stationary reference audio signal and an audio signal of interest,
the modified version of the non-stationary reference audio signal is an audio accompaniment signal, and
the audio signal of interest is a solo audio signal.

* * * * *